United States Patent
Mimura et al.

[11] Patent Number: 6,094,808
[45] Date of Patent: Aug. 1, 2000

[54] APPARATUS FOR MOUNTING ELECTRONIC COMPONENTS

[75] Inventors: Yoshihiro Mimura, Katano; Noriaki Yoshida, Ikeda; Takeshi Takeda, Toyono-gun; Kanji Hata, Katano, all of Japan

[73] Assignee: Matsushita Electric Industrial Co., Ltd., Osaka-fu, Japan

[21] Appl. No.: 09/192,400

[22] Filed: Nov. 16, 1998

Related U.S. Application Data

[62] Division of application No. 08/601,324, Feb. 16, 1996, Pat. No. 5,867,897.

[51] Int. Cl.$^7$ ................................................ H05K 3/30
[52] U.S. Cl. ................................ 29/743; 29/759; 29/740; 29/705; 29/840; 29/832
[58] Field of Search .............................. 29/832, 840, 740, 29/743, 760, 705, 741, 834, 759

[56] References Cited

U.S. PATENT DOCUMENTS 5,307,550   5/1994   Izume et al. .
5,498,942   3/1996   Ijuin .

FOREIGN PATENT DOCUMENTS 0 534 701   3/1993   European Pat. Off. .
0 627 877   12/1994  European Pat. Off. .

*Primary Examiner*—Lee Young
*Assistant Examiner*—Minh Trinh
*Attorney, Agent, or Firm*—Wenderoth, Lind & Ponack, L.L.P.

[57] ABSTRACT

An electronic component mounting apparatus for sucking up an electronic component and placing it onto a board with a suction nozzle, includes a step of switching over air pressure switching timings for the suction nozzle when the component is sucked with the suction nozzle and when the sucked component is mounted on the board. The air pressure switching timings are switched according to a velocity of up and down movement of the suction nozzle and independently for each of when the component is sucked with the suction nozzle and when the sucked component is mounted on the board. An electronic component mounting apparatus includes a suction nozzle for sucking an electronic component and placing it onto a board, a device for moving up and down the suction nozzle for suction and mounting of the electronic component, an air pressure switching unit for switching air pressure to the suction nozzle at an electronic component suction position and an electronic component mounting position, and a switching drive unit for performing switching control of the air pressure switching unit independently for each of when the component is sucked with the suction nozzle and when the sucked component is mounted on the board.

16 Claims, 20 Drawing Sheets

Fig.3

| COMPONENT SHAPE CODE | | 3216R |
|---|---|---|
| COMPONENT DIMENSIONS | TOP | 3.2 mm |
| | BOTTOM | 3.2 mm |
| | LEFT | 1.6 mm |
| | RIGHT | 1.6 mm |
| COMPONENT THICKNESS | | 1.0 mm |
| HEAD SPEED | | HIGH (1) |
| SUCTION NOZZLE No. | | 2 |
| WEIGHT | | 3 |

ANGULAR DISPLACEMENT OF INPUT SHAFT →

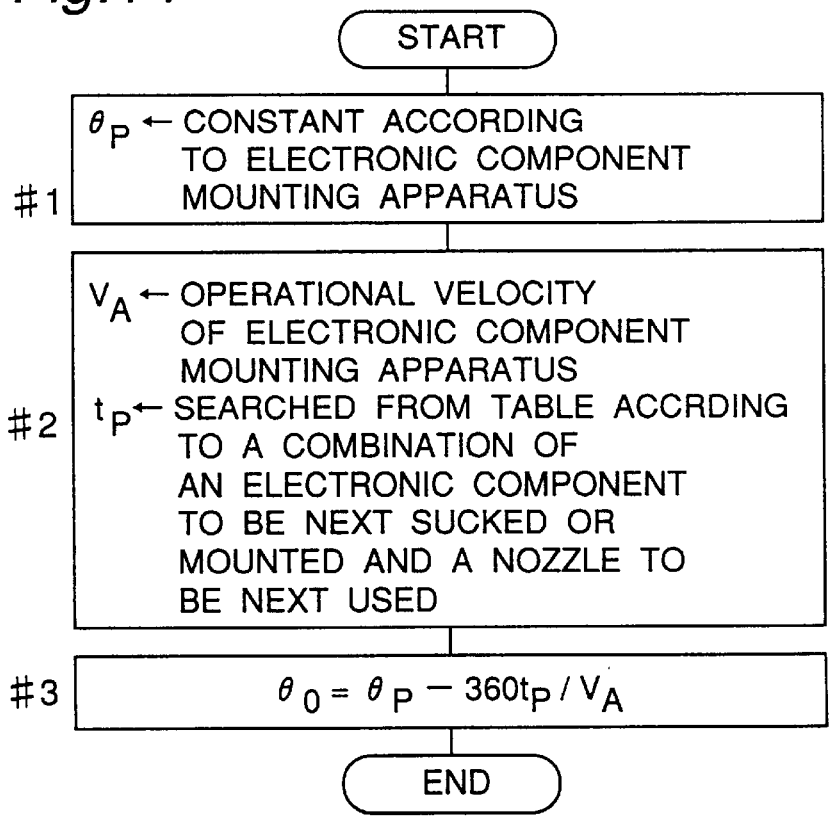
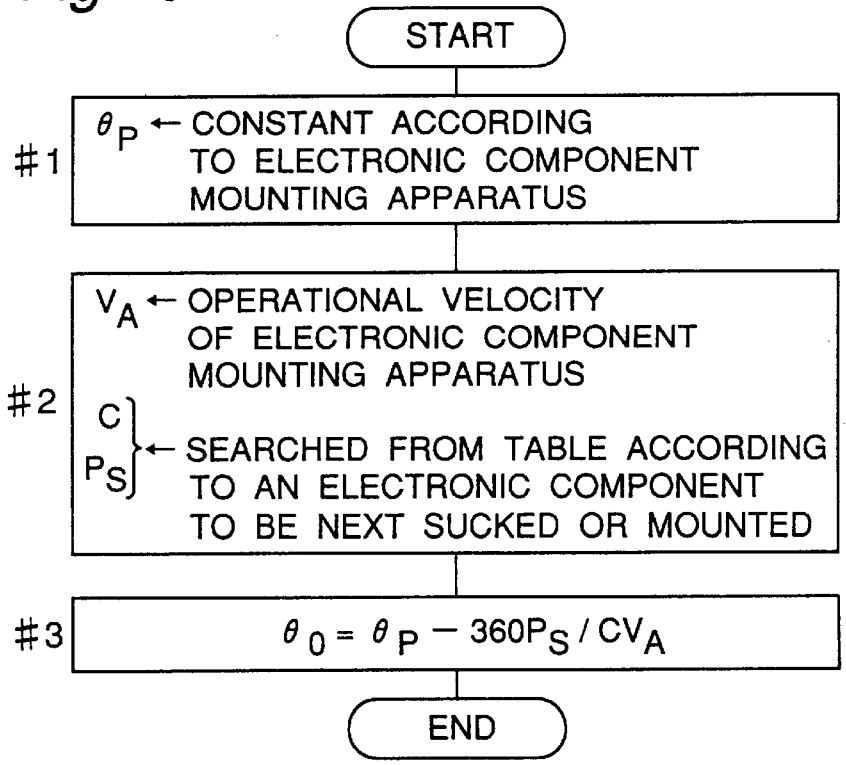

Fig. 26

NOZZLE A

| COMPONENT WEIGHT W(g) | 4 | 11 | 30 | ... |
|---|---|---|---|---|
| SUCTION-ENABLE LOWER LIMIT AIR PRESSURE $P_S$ (mmHg) | 100 | 150 | 250 | ... |
| $t_P$ (msec) | 10 | 16 | 28 | ... |

Fig. 27

NOZZLE B

| COMPONENT WEIGHT W(g) | 4 | 11 | 30 | ... |
|---|---|---|---|---|
| SUCTION-ENABLE LOWER LIMIT AIR PRESSURE $P_S$ (mmHg) | 100 | 150 | 250 | ... |
| $t_P$ (msec) | 12 | 19 | 32 | ... |

Fig. 28

NOZZLE A

| COMPONENT WEIGHT W(g) | 4 | 11 | 30 | ... |
|---|---|---|---|---|
| SUCTION-ENABLE LOWER LIMIT AIR PRESSURE $P_S$ (mmHg) | 100 | 150 | 250 | ... |
| C | 9.43 | | | |

Fig. 29

NOZZLE B

| COMPONENT WEIGHT W(g) | 4 | 11 | 30 | ... |
|---|---|---|---|---|
| SUCTION-ENABLE LOWER LIMIT AIR PRESSURE $P_S$ (mmHg) | 100 | 150 | 250 | ... |
| C | 8.0 | | | |

Fig. 30

| OPERATIONAL VELOCITY $V_A$ | 1 | 2 | 3 | 4 |
|---|---|---|---|---|
| $t_P$ (msec) | 17 | 20 | 23 | 27 |

APPARATUS FOR MOUNTING ELECTRONIC COMPONENTS

This is a Rule 1.53(b) Divisional of application Ser. No. 08/601,324 filed Feb. 16, 1996, now U.S. Pat. No. 5,867,897, issued Feb. 9, 1999.

BACKGROUND OF THE INVENTION

The present invention relates to an electronic component mounting method and apparatus for automatically mounting electronic components onto a board such as a circuit board or the like.

A common construction of a conventional electronic component mounting apparatus is explained by referring to FIG. 23. Reference numeral 31 denotes a rotating member 31 which is driven into intermittent rotation by motive power being transferred from a drive means 32 to an index device 34 via a speed reducer 33. Around the lower end of the rotating member 31, a plurality of suction nozzles 35 (35a, 35b, 35c, . . . ) are placed at equal intervals with an intermittent rotation pitch so as to be rotatable about their respective axes and also liftable. Each suction nozzle 35 communicates with a sucking device (not shown) via a pipe 36 projecting upward from an axial center of the index device 34. Further, mechanical valves 37 for changing the suction force are attached on the suction nozzles 35, respectively. Thus the electronic component mounting apparatus is so constructed that the suction forces of the suction nozzles 35 to electronic components are changed when the component is sucked with the suction nozzle, when the sucked component is mounted on the board, and when the sucked component is discharged (suction releasing operation for faulty components).

Further, the rotation of an input shaft 38 directed to the index device 34 is transferred to a cam shaft 40 via a timing belt 39, so that a rod 42 moves up and down according to the shape of the cam 41 as the cam 41 rotates. When a suction switch 43 of the mechanical valve 37 is turned on with the rod 42 moving up and down, the suction forces of the suction nozzles 35 are increased so that electronic components are sucked.

Further, a similar cam mechanism is provided for each of mounting and discharge of electronic components. When a release switch 44 of the mechanical valve 37 is turned on, the suction forces to the electronic components are lowered so that the suction is released.

Reference numeral 45 denotes a component feed unit, where a plurality of component feeders 47 are arranged in parallel on a movable table 46 which is movable in the X direction with a drive means 48 comprising a motor or the like. A tape on which a large number of electronic components are accommodated in a row is wound around a reel 47a fitted to each component feeder 47, so that the electronic components accommodated on the tape are pulled out one by one to a component feed position 50. Then when the component feed position 50 of any component feeder 47 is positioned just under the suction nozzle 35, the suction nozzle 35 is lowered so that the electronic component 51 is sucked up and taken out.

The suction nozzle 35 that has sucked up the electronic component 51 moves up, and the sucked electronic component 51 is conveyed forward, as viewed in FIG. 23, by the rotation of the rotating member 31. During this conveying process, the electronic component 51 is subject to angle correction. The angle correction is intended to adjust the mounting angle of the electronic component 51 with respect to a circuit board 52.

The circuit board 52, on which the electronic component 51 is mounted, is horizontally supported on a board support base 53. Since an X-axis drive mechanism 54 and a Y-axis drive mechanism 55 are coupled with the board support base 53, the circuit board 52 can be moved and positioned to any location in a horizontal plane.

When the electronic component 51 is mounted on the circuit board 52, the electronic component mounting position on the circuit board 52 is positioned just under the suction nozzle 35. Then the lowered suction nozzle 35 releases the electronic component 51 from suction, so that the electronic component 51 is mounted on the circuit board 52. After that, the suction nozzle 35 moves up to return back.

Such a sequence of operations completes the mounting operation for one piece of electronic component. When a plurality of electronic components are mounted, the above mounting operation is repeatedly performed with respect to each electronic component in accordance with a previously specified mounting order of electronic-component-mounting positional information.

However, in the constitution of the electronic component mounting apparatus, the mechanical valves 37 are switched over under the control by the cam 41 interlocked with the periodic operation of the electronic component mounting apparatus. Since the mechanical valve 37 is switched over at the same timing, the following issue would arise due to changes in the speed of mounting operation.

The operation of the electronic component mounting apparatus is completed by an input shaft 40 turning to one rotation (0 to 360 degrees). Displacement in air pressure (vacuum pressure) due to the switching of the mechanical valve 37 with respect to angular displacement of the input shaft 40 in a sucking operation is shown in FIG. 24A. A curve X is the air pressure displacement curve while a curve Y is the nozzle height displacement curve. It is clear from FIG. 24A that a certain time is required after a switch of the mechanical valve 37 until an air pressure necessary for the suck-up of the electronic component is reached.

In order that the electronic component 51 is sucked up by the suction nozzle 35 in a stable manner, an expression (1) must be satisfied among an angle $\theta_P$ of the input shaft 40 formed when the curve X in FIG. 24A reaches a suction-enabling lower limit air pressure $P_S$, a lower limit angle $\theta_L$ and an upper limit angle $\theta_U$ of the input shaft 40 formed while the curve y keeps at a zero nozzle height. It is noted that reference character T denotes a time required for the input shaft 40 to turn one rotation at a reference operational velocity of the present description.

$$\theta_L < \theta_P < \theta_U \tag{1}$$

However, when the operational velocity of the electronic component mounting apparatus is increased (so the nozzle cycle rate, or rate at which the nozzle moves up and down from an upper position through a lower position and to an upper position again, also increases), the suction nozzle 35 starts to turn back upward before the suction force of the suction nozzle 35 reaches a suction-enabling lower limit air pressure $P_S$ as shown in FIG. 24B. Thus, a relationship represented by an expression (2) results, where the relationship of the expression (1) is not satisfied such that the electronic component 51 could no longer be sucked:

$$\theta_L < \theta_U < \theta_P \tag{2}$$

Conversely, when the operational velocity of the electronic component mounting apparatus is lowered, the suction force of the suction nozzle 35 reaches the suction-enabling lower limit air pressure $P_S$ before the suction nozzles 35 reach the suction position, as shown in FIG. 24C. Thus, a relationship represented by an expression (3) results, where the expression (1) could no longer be satisfied such that suction failures, such as erect suction, are more likely to occur:

$$\theta_P < \theta_L < \theta_U \quad (2)$$

As seen above, if the mechanical valve 37 is switched over at the same timing, the range of operational velocity is limited such that the suction stability deteriorates in high-speed and low-speed ranges. In addition, whereas the above explanation has been exemplified above by sucking operation, the case is similar to the mounting operation, where the suction release timing in the high-speed and low-speed ranges becomes unstable such that the mounting precision would not be ensured and therefore mounting failures would be more likely to occur.

SUMMARY OF THE INVENTION

Accordingly, an object of the present invention is to provide an electronic component mounting method and apparatus which allows stable sucking and mounting operations to be attained even when the electronic component mounting speed is varied.

In accomplishing these and other aspects, S according to one aspect of the present invention, there is provided an electronic component mounting method for sucking up an electronic component and placing it onto a board with a suction nozzle. The method comprises a step of switching over air pressure switching timings for the suction nozzle when: the component is sucked with the suction nozzle; the sucked component is mounted on the board according to a velocity of up and down movement of the suction nozzle (i.e., cycle rate, or rate at which the nozzle moves up and down from an upper position through a lower position and to an upper position again); and independently for each of when the component is sucked with the suction nozzle and when the sucked component is mounted on the board.

According to another aspect of the present invention, there is provided an electronic component mounting apparatus comprising:

a suction nozzle for sucking an electronic component and placing it onto a board;

a device for moving the suction nozzle up and down for suction and mounting of the electronic component;

an air pressure switching unit for switching air pressure to the suction nozzle at an electronic component suction position and an electronic component mounting position; and a switching drive unit for performing switching control of the air pressure switching unit independently for each of when the component is sucked with the suction nozzle and when the sucked component is mounted on the board.

BRIEF DESCRIPTION OF THE DRAWINGS

These and other aspects and features of the present invention will become clear from the following description taken in conjunction with the preferred embodiments thereof with reference to the accompanying drawings, in which:

FIG. 3 is an explanatory view of part of electronic-component specifications information in the first embodiment;

FIG. 14 is a flow chart showing the operation of the sixth embodiment of the present invention;

FIG. 15 is a flow chart showing the operation of the seventh embodiment of the present invention;

FIGS. 26, 27, 28, and 29 are tables used in the embodiments of the present invention;

FIG. 30 is a table used in an embodiment of the present invention; and

DETAILED DESCRIPTION OF THE PREFERRED EMBODIMENTS

Figure 1:
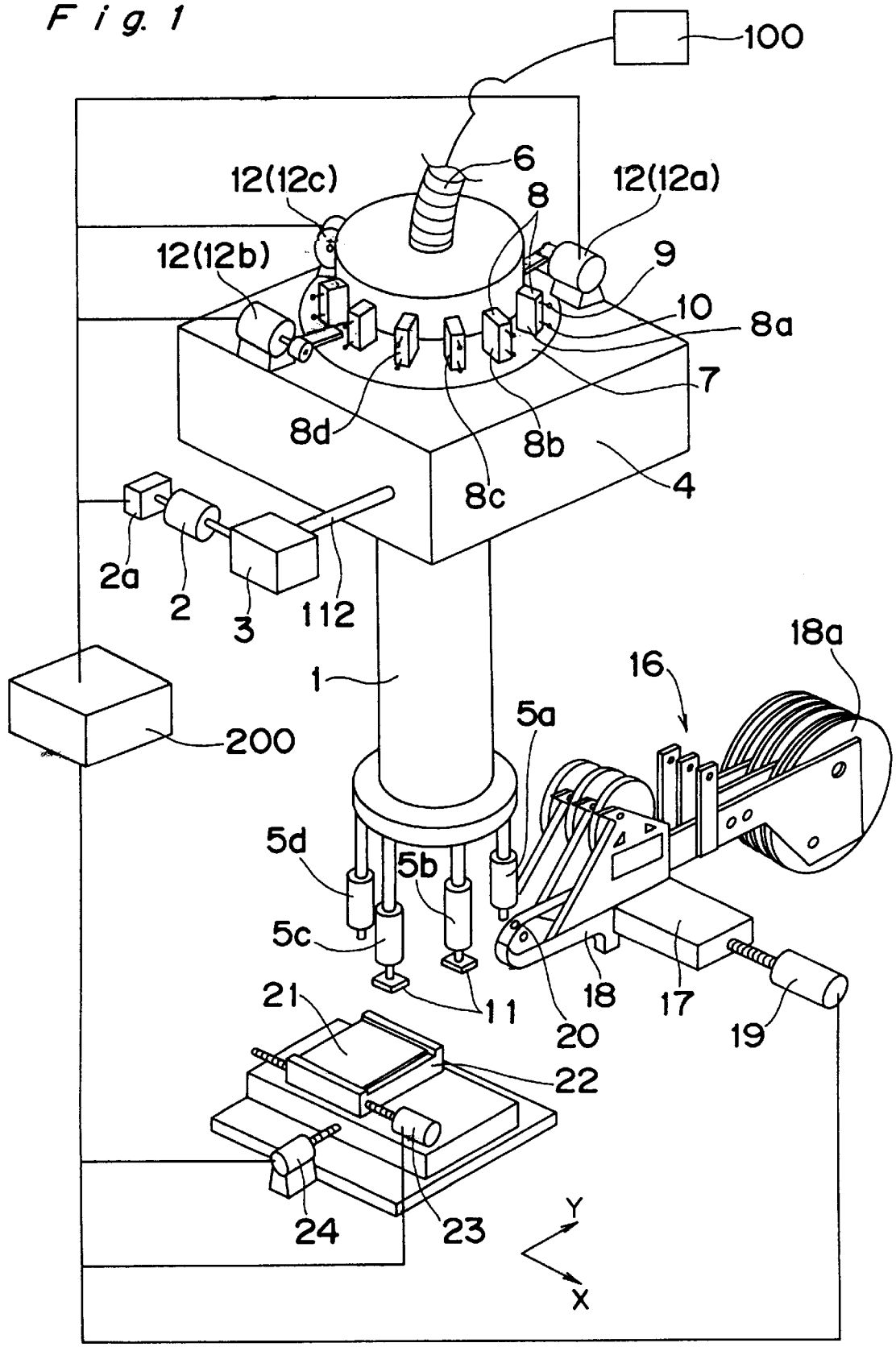
FIG. 1 is a perspective view showing the general construction of an electronic component mounting apparatus according to a first embodiment of the present invention.

Before the description of the present invention proceeds, it is to be noted that like parts are designated by like reference numerals throughout the accompanying drawings.

An electronic component mounting apparatus according to a first embodiment of the present invention will be explained below by referring to FIGS. 1 through 3.

Reference numeral 1 denotes a rotating member which is driven into intermittent rotation when motive power derived from a drive means 2, such as a motor having a rotary encoder 2a as a rotational angle detection means, is transferred to an index device 4 via a speed reducer 3. Around the lower end of the rotating member 1, a plurality of suction nozzles 5 (5a, 5b, 5c, ...) are placed at equal intervals with an intermittent rotation pitch so as to be rotatable about their respective axes and also liftable. Each suction nozzle 5 communicates with a sucking device 100 via a pipe 6 projecting upward from an axial center of the index device 4.

On top of the index device 4, there are provided a rotary disc 7 which rotates integrally with the rotating member 1. Further thereon, mechanical valves 8 are provided as an example of an air-pressure switching device which switches the suction forces of the suction nozzles 5 in correspondence to the individual suction nozzles 5, so that the suction force of the suction nozzles 5 is changed when the components 11 are sucked with the suction nozzles 5, when the sucked components 11 are mounted on the board, and when the sucked components 11 are discharged (suction releasing operation for faulty components). In addition, reference numeral 9 denotes a suction switch of the mechanical valve 8, and 10 denotes a release switch thereof.

The pipe 6 provided at the top of the apparatus is divided into a plurality of suction air passages, which are connected to the plurality of suction nozzles 5a, 5b, 5c, 5d, etc., respectively and independently so that the suction nozzle 5 sucks the electronic component 11 at the component feed position 20 by the suction force of the sucking device 100 provided at the other end of the pipe 6. In this case, the mechanical valves 8a, 8b, 8c, 8d, etc., open and close their respective suction air passages over the ranges from the pipe 6 to the suction nozzles 5a, 5b, 5c, 5d, etc., thereby controlling the suction forces to implement the switching when the component is sucked with the suction nozzle, when the sucked component is mounted on the board, and when the sucked component is discharged (faulty components will be discharged without being mounted).

Further, switching drive units 12 (12a, 12b, and 12c), including a motor 13 etc., for switching the mechanical valves 8 in correspondence to the suction, mounting, and discharge positions of the electronic components 11 by the suction nozzles 5 are arranged on the outer side of the rotary disc 7 on the top surface of the index device 4. When the suction switch 9 of the mechanical valve 8 is turned on by the switching drive unit 12, the suction force of the suction nozzle 5 increases so that the electronic component 11 is sucked up. When the release switch 10 is turned on, the suction force of the suction nozzle 5 to the electronic component 11 decreases so that the suction is released and, as a result, the electronic component 11 is mounted or discharged. For this operation, the operation timings of the switching drive units 12a, 12b, 12c are independently set for individual purposes of the suction, mounting, and discharge operations.

Figure 2:
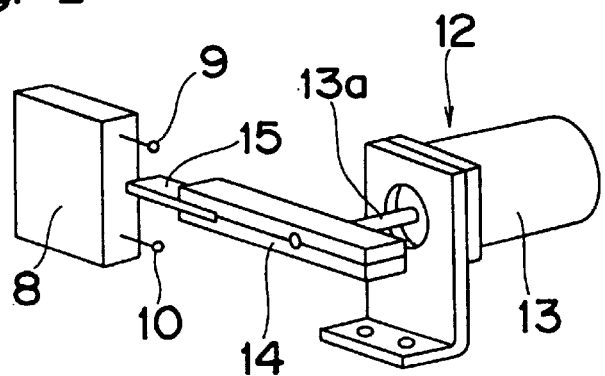
FIG. 2 is a detailed perspective view of the switching drive unit for mechanical valves in the first embodiment.

The switching drive unit 12, as shown in FIG. 2, comprises the motor 13, a rocking lever 14 fixed to a motor shaft 13a of the motor 13 and reciprocatingly rocked, and an acting piece 15 provided at an end of the rocking lever 14 to act on the suction switch 9 and the release switch 10.

Reference numeral 16 denotes a component feed unit which is so constructed that a plurality of component feeders 18 are equipped so as to be arranged in parallel on a movable table 17. The movable table 17 can be reciprocatingly moved in the X direction with a drive motor 19 comprising a motor or the like. A tape on which a large number of electronic components are accommodated in a row is wound around a reel 18a fitted to each component feeder 18, so that the electronic components accommodated on the tape can be pulled out one by one to a component feed position 20. The electronic components accommodated on each tape are of the same kind for each tape.

In this component feed unit 16, when this component feed position 20 for any component feeder 18 is positioned just under the suction nozzle 5, the suction nozzle 5 is lowered so that the electronic component 11 is sucked up and taken out.

More specifically, as the movable table 17 moves reciprocatingly in the X direction, any arbitrary component feeder 18 is positioned at the component feed position 20, and the intermittent rotation of the rotating member 1 under specified conditions causes the suction nozzle 5 to be positioned just above the electronic component 11 located at the component feed position 20. Then, the suction nozzle 5a lowers as the suction switch 9 is turned on by the switching lever 15 fitted to a suction/release drive unit 12a as described above, and the switch 9 is turned on before the tip of the suction nozzle 5a makes contact with the electronic component 11 located at the component feed position 20. As a result, the suction force of the suction nozzle 5a increases enough to suck up the electronic component 11 located at the component feed position 20.

The suction nozzle 5, sucking up the electronic component 11, moves up and the sucked electronic component 11 is conveyed forward in FIG. 1 by the rotation of the rotating member 1. During this moving process, the electronic component 11 sucked up by the suction nozzle 5a is recognized by an unshown recognition means. Depending on the result of this recognition, the angle at which the electronic component 11 is sucked by the suction nozzle 5a is corrected, so that the mounting angle for the electronic component 11 becomes correct.

The circuit board 21, on which the electronic component 11 is to be mounted, is horizontally supported on a board support base 22. Since the X-axis drive mechanism 23 and the Y-axis drive mechanism 24 are coupled with the board support base 22, the circuit board 21 can be moved and positioned at any arbitrary position in a horizontal plane by driving the mechanisms 23, 24.

When the electronic component 11 is mounted onto the circuit board 21, the suction nozzle 5a that has sucked up the electronic component 11 is stopped at the mounting position by the rotating member 1 rotating intermittently under specified conditions. The electronic component mounting position on the circuit board 21 is positioned at just under the suction nozzle 5a. The suction nozzle 5a lowers to release and mount the electronic component 11 at the electronic component mounting position, and then moves up. Upon fully moving up, the suction nozzle 5a returns to the component sucking position again by the rotating member 1 rotating intermittently under specified conditions, and then repeats the same operation.

As a result of the recognition by the recognition means, which is done when the electronic component 11 is sucked by the suction nozzle 5a, if the electronic component 11 has been decided to be faulty, then the suction nozzle 5a does not effect the mounting at the electronic component mounting position. Instead the suction nozzle 5a, while keeping sucking up the electronic component 11 that has been determined to be faulty, rotates up to a faulty component discharge position. At this position, the release switch 10 is turned on by the suction/release drive unit 12c, so that the suction nozzle 5a releases the sucked electronic component 11.

Such a sequence of operations completes the mounting operation for one piece of electronic component 11. When a plurality of electronic components are mounted, the above mounting operation is repeatedly performed with respect to each electronic component 11 in accordance with a previously specified mounting order of electronic-component-mounting positional information.

Further, in the electronic component mounting apparatus having the general construction as described above, its operational velocity is stepped into three modes: high-speed operation, middle-speed operation, and low-speed operation. For each of these operation modes, a switching timings of the mechanical valves 8 by the switching drive units 12a, 12b, 12c are set. Since the electronic component mounting apparatus operates based on data including electronic-component-mounting positional information, electronic-component-feed positional information, electronic-component-specifications information, and so on, the switching timings are selected and set by using such information. For example, FIG. 3 is an excerpt of the electronic-component specifications information, wherein the item of 'head speed' represents the operational velocity of the electronic component mounting apparatus at which the electronic components are mounted. By using this information, the three-step operational velocities are determined, and based on the determination, the switching timings for the switching drive units 12a, 12b, 12c are set. In addition, the item 'component shape code' in FIG. 3 refers to the index for identifying the type of an electronic component, the item 'component dimensions' refers to the sizes of top, bottom, left, and right of the electronic component, the item 'component thickness' refers to the thickness of the electronic component, and the item 'suction nozzle' refers to the size of a nozzle to be used for mounting the electronic component. The item 'weight' refers to the classification of weight of the electronic components.

With the timings set in this way, the suction switches 9 and the release switches 10 of the mechanical valves 8 are operated by the switching drive units 12a, 12b, 12c, whereby stable suction operation and mounting operation are realized at an arbitrary operational velocity.

Figure 25:
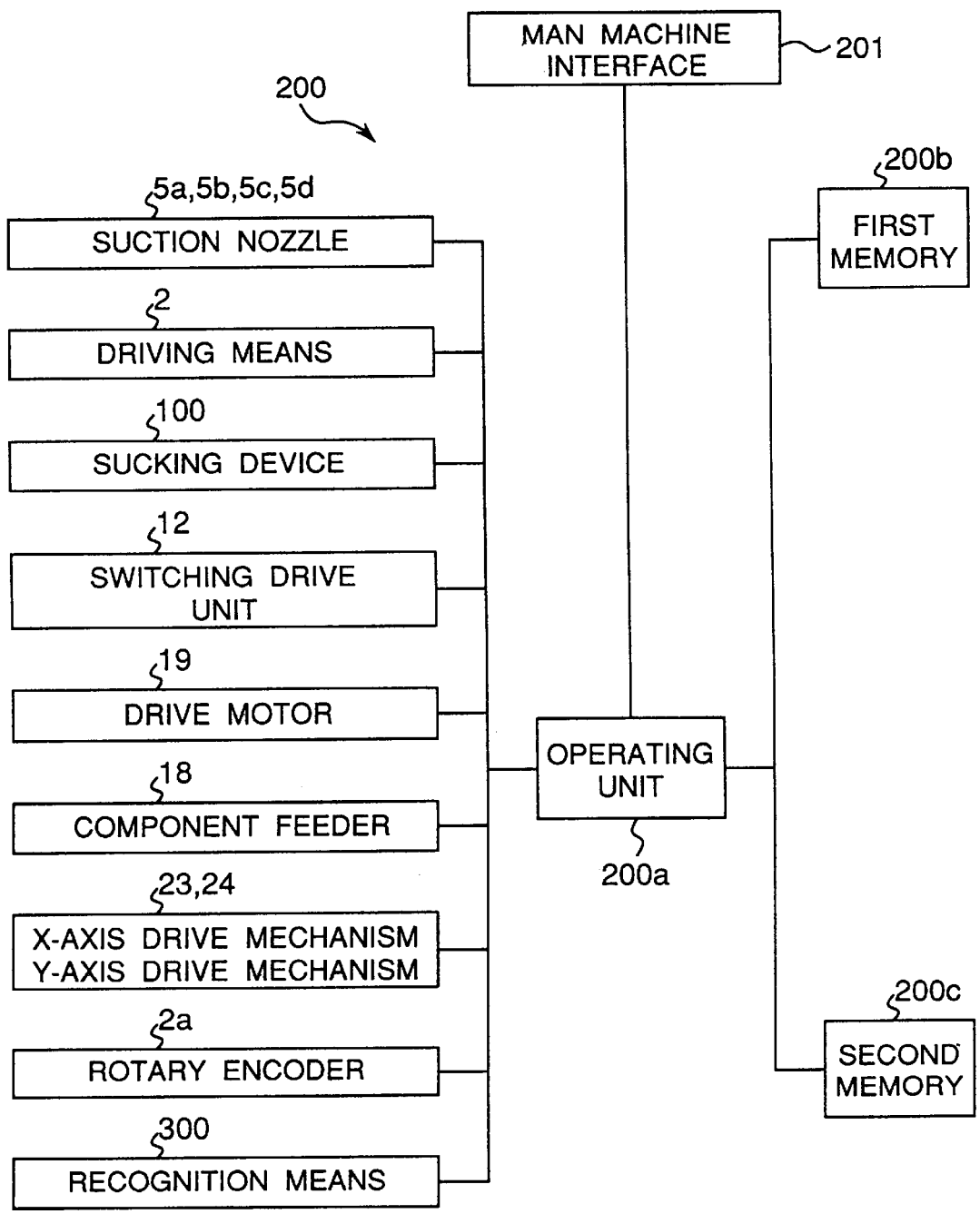
FIG. 25 is a block diagram showing a control unit of an embodiment of the present invention.

As shown in FIG. 25, the operations of the suction nozzles 5, driving means 2, sucking device 100, switching drive units 12, drive motor 19, component feeder 18, X-axis drive mechanism 23, Y-axis drive mechanism 24, and recognition means 300 are controlled by a control unit 200 based on input signals from the rotary encoder 2a, the recognition means 300, etc. and data or information such as production programs, weight, dimensions, and types of electronic components etc. input through a man machine interface 201. The control unit 200 includes an operating unit 200a connected to the above various devices and the man machine interface 201, a first memory 200b, and a second memory 200c. Both the first memory 200b and second second memory 200c are connected to the operating unit 200a. The first memory 200b stores data indicating characteristics such as dimensions, weights etc. of electronic components, inner diameters of nozzle holes of the suction nozzles 5, and the operating speed of the mounting apparatus. The second memory 200c stores tables showing relationship among the types of the suction nozzles, the weight of the components to be mounted, a suction-enabling lower limit air pressure $P_S$ (sec), a time $t_P$ (sec) until the suction-enabling lower limit air pressure $P_S$ (sec) is reached, (which are described later and shown in FIGS. 26 and 27 as examples) and tables showing the relationship among the types of the suction nozzles, the weight of the components to be mounted, the suction-enabling lower limit air pressure $P_S$ (sec), and a gradient ($C=P_S/t_P$), (which are described later and shown in FIGS. 26 and 27 as examples) and a program for timers which are described later. The second memory 200c also stores a table showing relationship between operational velocities $V_A$ of the electronic component mounting apparatus and the a time $t_P$ (sec) which is shown in FIG. 30 as one example. Although the three-step operational velocities are described in the embodiment, this table of FIG. 30 shows one example wherein the operational velocities have four-step operational velocities of levels of 1 through 4 from the higher to lower velocities in which the level 1 is the highest velocity and the level 4 is the lowest velocity. Therefore, the operating unit 200a calculates the operational velocity of the electronic component mounting apparatus based on the data including electronic-component-mounting positional information, electronic-component-feed positional information, electronic-component-specifications information, and so on stored in the first memory 200b and the second memory 200c. Then, the control unit 200 controls the operations of the various devices based on the calculated operational velocity.

Figure 4:
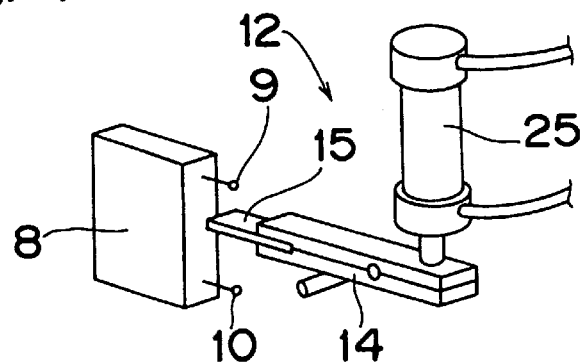
FIG. 4 is a detailed perspective view of another example of the switching drive unit for mechanical valves.
Figure 5:
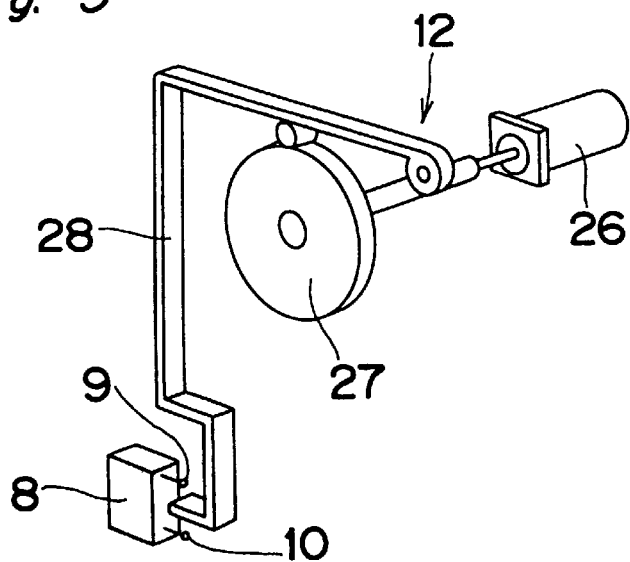
FIG. 5 is a detailed perspective view of still another example of the switching drive unit for mechanical valves.

The switching drive unit 12 in the above first embodiment has been exemplified by one which uses the motor 13 as its driving means, as shown in FIG. 2. However, the switching drive unit 12 may also be one which uses a cylinder 25 as the driving means as shown in FIG. 4. Further, it may be so arranged that the suction switch 9 and the release switch 10 are operated by moving a rod 28 up and down with a cam 27 that is driven by a motor 26 as shown in FIG. 5.

Further, in the above example, the timings for the mechanical valves 8 are switched over in three steps in correspondence to the operational velocity. However, the timings can be set in any number of steps according to applications.

According to the electronic component mounting method of the above embodiment of the present invention, as apparent from the above description, appropriate switching timings for air pressure to the suction nozzles are previously determined from the operational velocity of the electronic component mounting apparatus and air pressure variation characteristics. By switching over the air pressure to the suction nozzle according to the operational velocity of the electronic component mounting apparatus based on the determined switching timings, suction failures and faulty mounting can be prevented beforehand even if the mounting speed has changed. Thus, stable sucking operation and mounting operation can be carried out.

Further, according to the electronic component mounting apparatus of the above embodiment of the present invention, there are provided a switching device for air pressure to the suction nozzles, and switching drive units that each independently perform the switching control in the sucking process, where electronic components are sucked with the suction nozzles, and the mounting process, where the sucked electronic components are mounted on the boards. Thus, the aforementioned method can be appropriately implemented.

Further, when the timing for switching air pressure is changed in steps according to the mounting speed, then stable sucking operation and mounting operation can be realized easily and with simple construction.

Next, in the electronic component mounting apparatus using the electronic component mounting method according to the first embodiment, the way of calculating the switching timing for the mechanical valves corresponding to the operational velocity of the electronic component mounting apparatus will be described below with reference to FIGS. 1, 3, 6, and 7.

First described are disadvantages of the method in which a plurality of aforementioned switching timings are stored and selectively used according to the operational velocity of the electronic component mounting apparatus.

As described above, there is the method in which the switching timing for the mechanical valves is selectively used in correspondence to the operational velocity of the electronic component mounting apparatus from among several patterns of switching timing previously stored on the presumption of variations in the operational velocity of the electronic component mounting apparatus. However the previously stored several patterns of switching timing are discrete values, there is a disadvantage that optimum suction/release timing respectively for various types of operational velocities are difficult to implement.

Also, there has never been established a method for treating a time lag from when a switch of the mechanical valve in a case where the component is sucked with the suction nozzle or a case where the sucked component is released from the suction nozzle for mounting or discharging is effected to when the suction nozzle actually sucks or releases the electronic component. Therefore, is another disadvantage that the selection of switching timing would result in repeated trial and error.

Further, the sucking state of the suction nozzles to the electronic components is affected not only by the operational velocity of the electronic component mounting apparatus, but also by such elements as the characteristics of electronic components (weight, shape, etc.), characteristics of the electronic component mounting apparatus (diameters of nozzle holes of suction nozzles, etc.), and the like, as will be described below. Therefore, it is better in some cases that these elements may be taken into consideration as a factor in the method for setting the mechanical valve switching timing, as still another disadvantage.

This disadvantage of timing could be discussed more strictly as follows.

Figure 18:
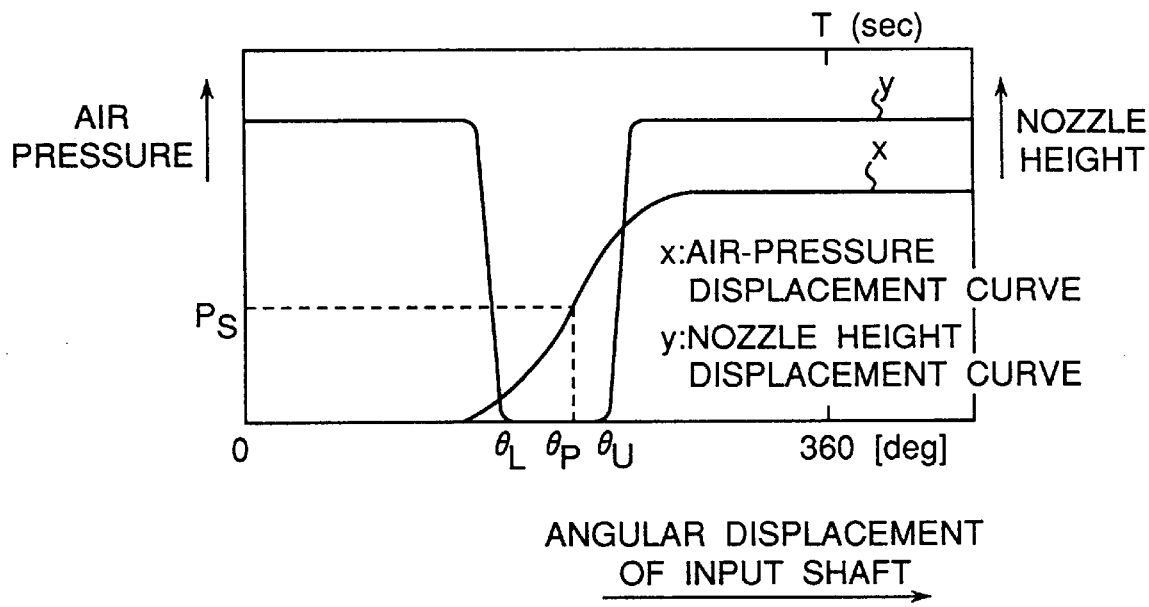
FIG. 18 is a chart showing issues of an electronic component mounting method according to the prior art.
Figure 19:
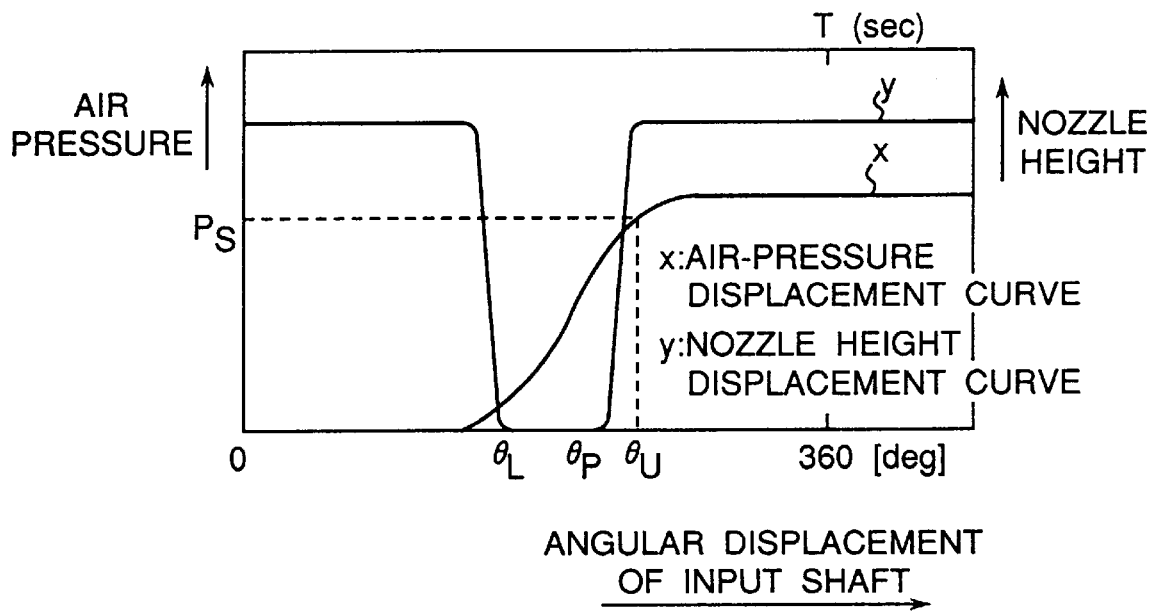
FIG. 19 is a chart showing issues of the electronic component mounting method according to the prior art.
Figure 20:
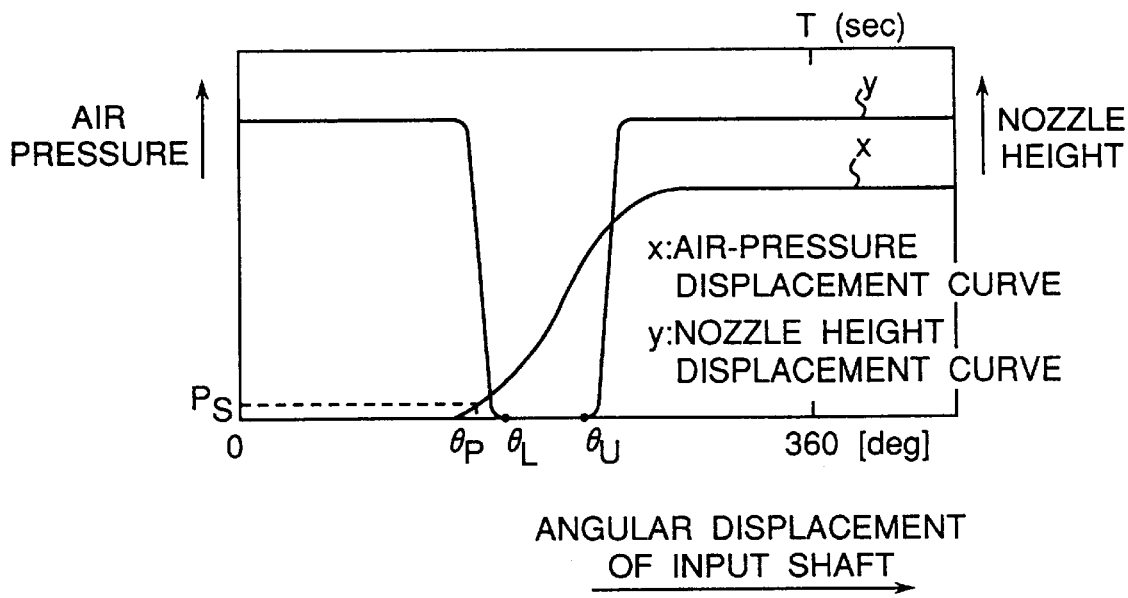
FIG. 20 is a chart showing issues of the electronic component mounting method according to the prior art.

(1) The relationship between the timings of opening and closing the mechanical valve and the weights of electronic components is as shown in FIGS. 18 to 20.

Referring to FIG. 18, the abscissa axis represents time, where T denotes the time for which the rotating member 1 is operating intermittently under specified conditions. That is, T denotes the time in which an input shaft 112 continuously rotating at a constant speed turns one rotation, in conjunction with the explanation of FIG. 1. Then, during this time T, the suction nozzles 5 perform their respective sucking, mounting, and discharging processes independently. With respect to the abscissa axis, T(sec) is shown at the top, and an angular displacement of 360 (deg) of the input shaft 112 is shown at the bottom. The curve x is an air pressure displacement curve, while the curve y is a suction nozzle height displacement curve, where the curve y results in a unique constant pattern in each electronic component mounting apparatus. $P_S$ is the suction-enabling lower limit air pressure. In this case, the higher the operational velocity of the electronic component mounting apparatus, the shorter the time T (sec), whereas later-described angles $\theta_L$, $\theta_U$ with respect to the angular displacement of 360 (deg) of the input shaft 112 remain unchanged.

Then, referring to FIG. 18, in order that the suction nozzle 5a sucks an electronic component 11, the following expression (1) needs to be satisfied among an angular displacement $\theta_P$ of the input shaft 112, which occurs when the suction switch 9 of the mechanical valve 8a is opened so that the suction force of the suction nozzle 5a increases until the curve x moves up, reaching the suction-enabling lower limit air pressure $P_S$; an angular displacement $\theta_L$ of the input shaft 112, as shown by the curve y, which occurs when the suction nozzle 5a lowers until its height becomes 0 with respect to the component feed position 20; and an angular displacement $\theta_U$ of the input shaft 112 at which the suction nozzle 5a begins to move up:

$$\theta_L < \theta_P < \theta_U \qquad (1)$$

Then, even if a timing satisfying the expression (1) is set on an electronic component of a certain weight, increased weight of the electronic component to be sucked would cause the value of the suction-enabling lower limit air pressure $P_S$ to increase as shown in FIG. 19, resulting in the relationship as shown by the expression (2). Accordingly, there is a disadvantage that the suction nozzle 5a may return upward before sucking an electronic component so as to mis-suck the electronic component:

$$\theta_L < \theta_U < \theta_P \qquad (2)$$

Conversely, smaller weight of the electronic component to be sucked would cause the value of the suction-enabling lower limit air pressure $P_S$ to decrease as shown in FIG. 20, resulting in the relationship as shown by the expression (3). Accordingly, there is a disadvantage that the suction nozzle 5a may suck up the electronic component before reaching the positioning point, such that the electronic component could not be correctly sucked but may be erectly sucked:

$$\theta_P < \theta_L < \theta_U \qquad (3)$$

Further, the suction-enabling lower limit air pressure $P_S$ is dependent on not only the weight of electronic components but various characteristics including their shape and the like.

Figure 21:
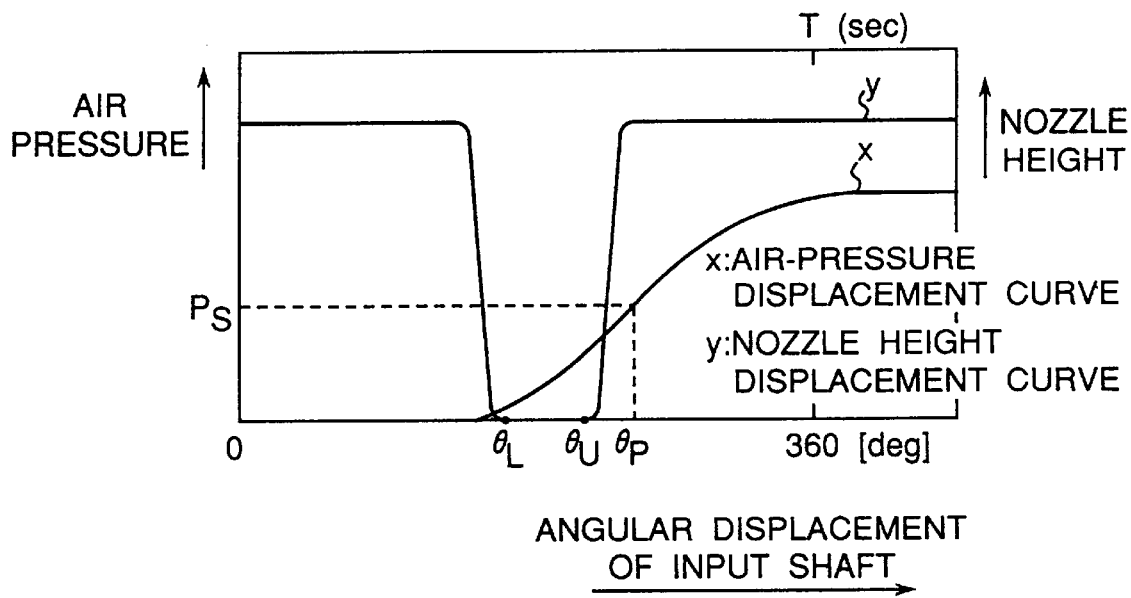
FIG. 21 is a chart showing issues of the electronic component mounting method according to the prior art.
Figure 22:
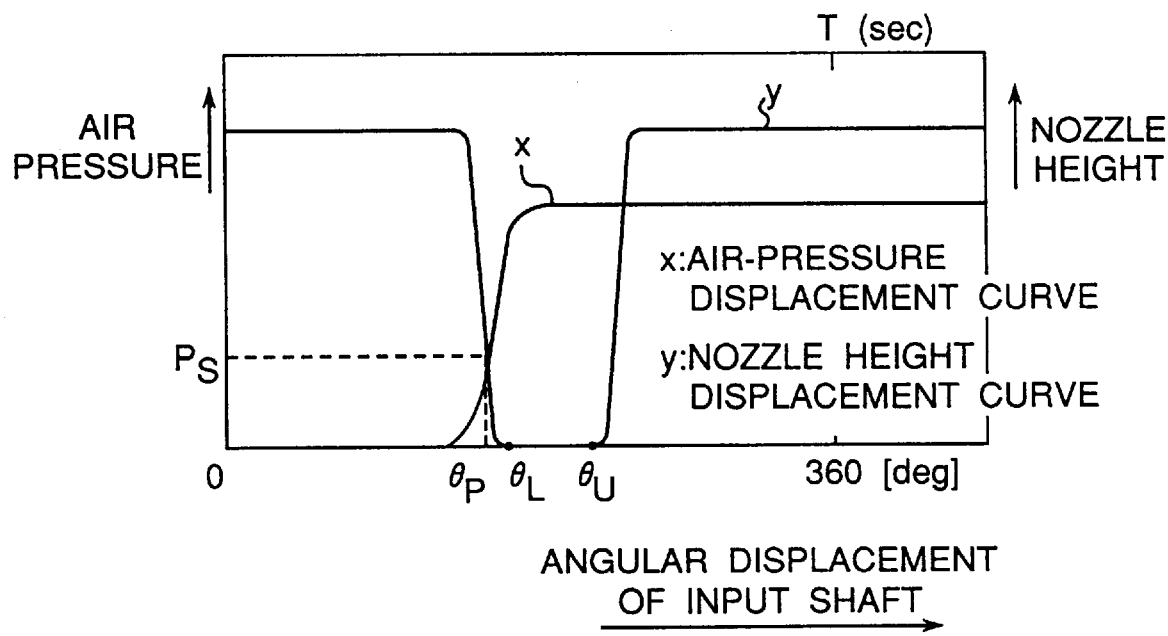
FIG. 22 is a chart showing issues of the electronic component mounting method according to the prior art.
Figure 23:
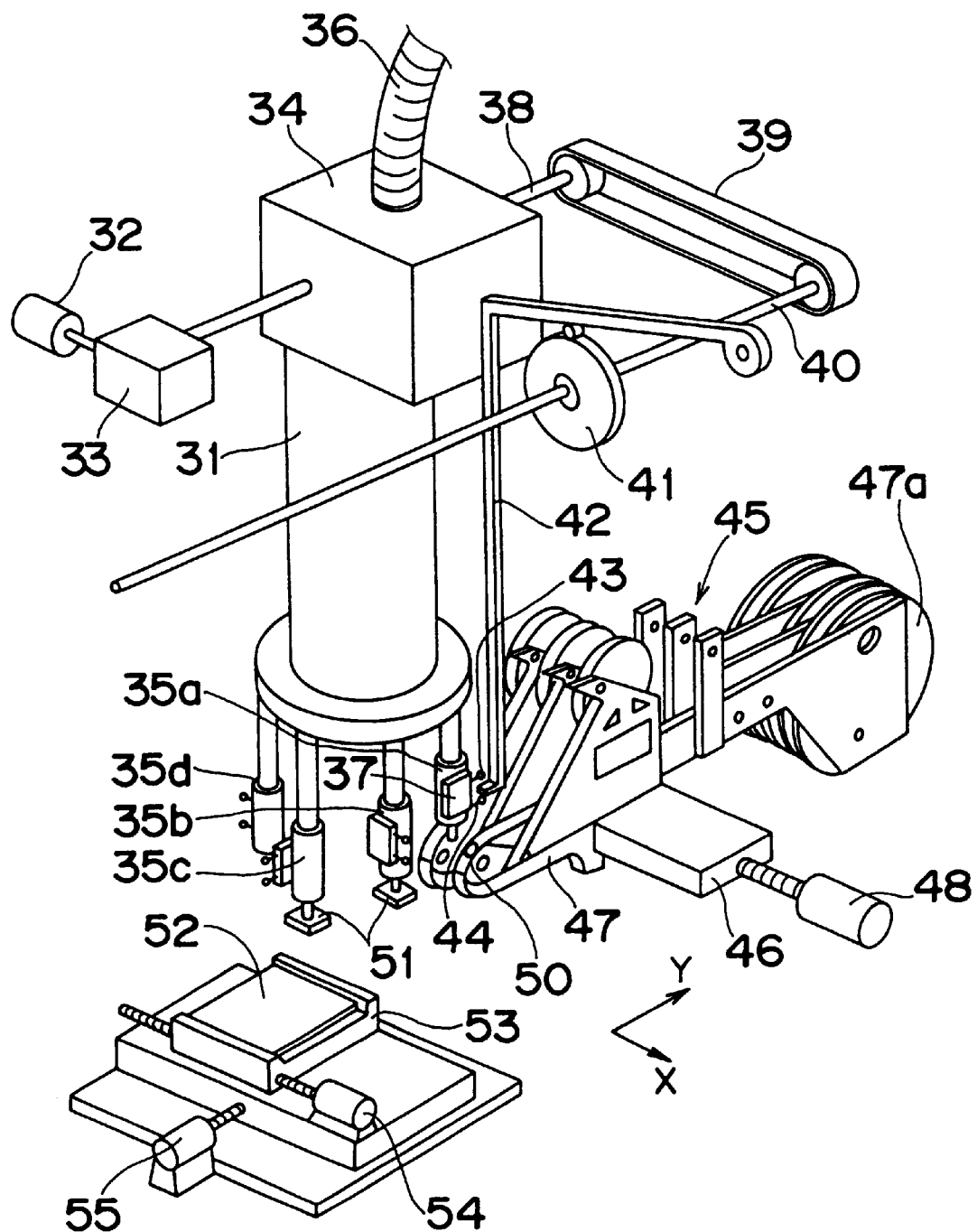
FIG. 23 is a perspective view showing the general construction of an electronic component mounting apparatus according to the prior art.
Figure 24A:
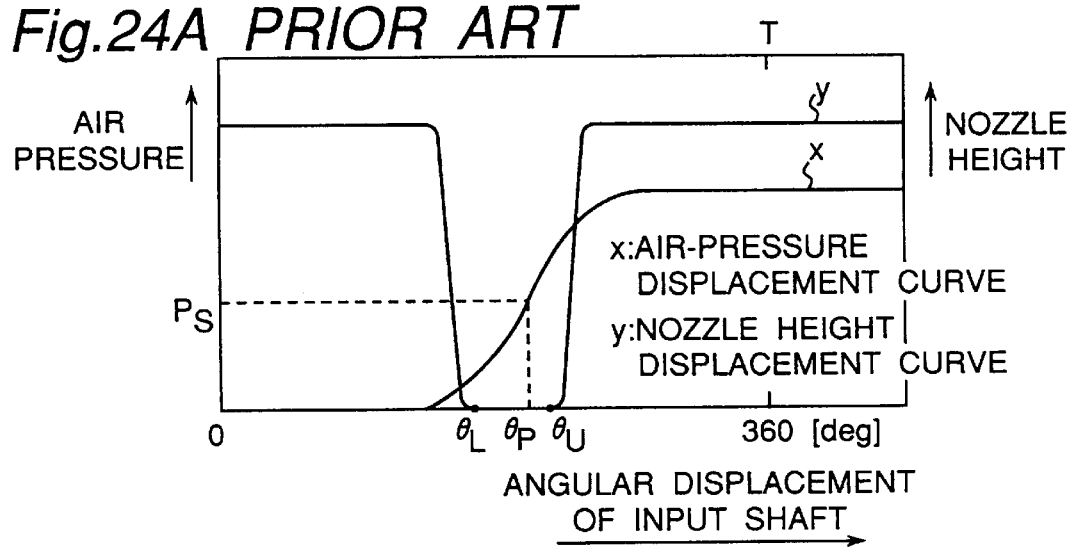
FIGS. 24A, 24B, 24C are explanatory views of the relationship between the displacement in air pressure with respect to suction nozzles in various operational velocity ranges and the height position of suction nozzles in the prior art example.
Figure 24B:
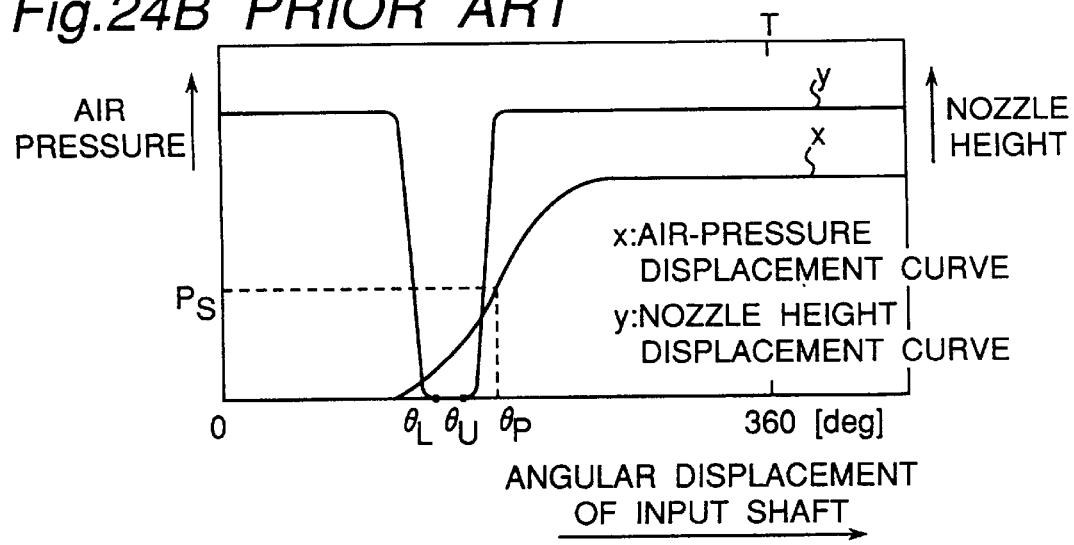
Figure 24C:
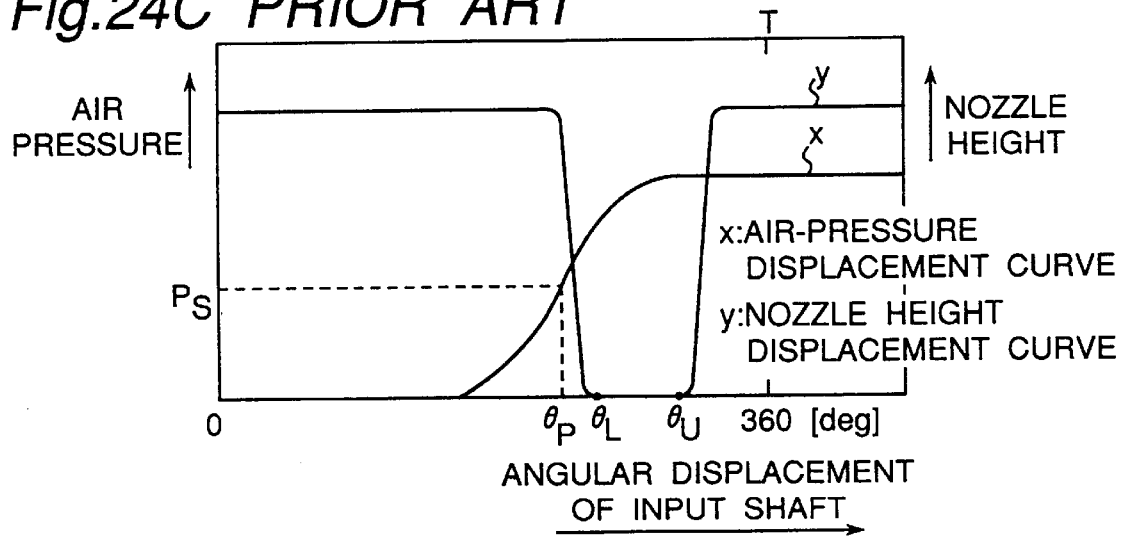

(2) The relationship between the timing of opening and closing the mechanical valve and the characteristics of the electronic component mounting apparatus, for example, the diameter of the nozzle hole is as shown in FIGS. 18, 21, and 22.

Given a diameter of the nozzle hole of the suction nozzle 5a, the relationship of the expression (1) holds as shown in FIG. 18. Even if the suction nozzle 5a sucks up the electronic component appropriately, if the suction nozzle 5a is replaced by one having a larger diameter of nozzle hole, it would take longer time for the air-pressure displacement curve x to rise as shown in FIG. 21, resulting in the relationship as shown by the expression (2). This leads to a disadvantage that the suction nozzle 5a returns upward before the suction-enabling lower limit air pressure $P_S$ is reached, causing a mis-suction.

Conversely, when the suction nozzle 5a is replaced by one having a smaller diameter of nozzle hole, it would take shorter time for the air-pressure displacement curve x to rise as shown in FIG. 20, resulting in the relationship as shown by the expression (3). This leads to a disadvantage that the suction nozzle 5a may suck up the electronic component before reaching the positioning point, such that the electronic component would be mis-sucked, for example, erectly sucked.

The above description has been made for the case of suction with respect to the relationship between the characteristics of electronic components or characteristics of the electronic component mounting apparatus and the opening/closing timing of the mechanical valve. Likewise, also in the case of mounting, a similar relationship holds only when the air-pressure displacement curve x is inverted in gradient.

The following method according to embodiments allows the aforementioned disadvantages to be solved and makes it possible to suck and release electronic components at optimum timing at all times without trial and error.

In addition, the following description is based on the assumption that the rotating member 1 will be operated intermittently when the continuously rotating input shaft 112 as shown in FIG. 1 turns one rotation, and that a sucking operation of an electronic component, a mounting operation of an electronic component, a discharging operation of an electronic component, and the like are completed respectively and independently each time the input shaft 112 turns one rotation.

Further, the electronic component assembling apparatus operates based on data including electronic-component-mounting positional information, electronic-component-feed positional information, and electronic-component specifications information etc. For example, FIG. 3 is an excerpt of the electronic-component-specifications information, where the item 'component shape code' refers to the index for identifying the type of an electronic component, the item 'component dimensions' refers to the sizes of top, bottom, left, and right of the electronic component, and the item 'component thickness' refers to the thickness of the electronic component. Also, the item 'head speed' refers to the operational velocity of the electronic component mounting apparatus in the mounting process of the electronic component, the item 'suction nozzle' refers to the size of a suction nozzle to be used for mounting the electronic component, and the item 'weight' refers to the classification of weight of the electronic components.

Figure 6:
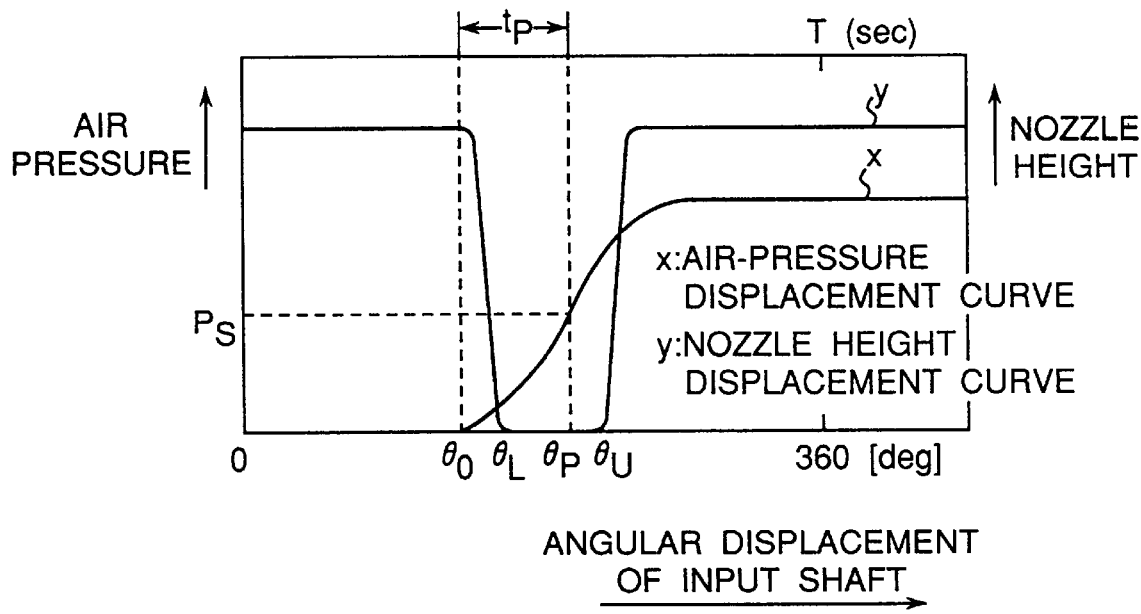
FIG. 6 is a chart showing the way of determining optimum suction and release timing in the first and second embodiments of the present invention.
Figure 7:
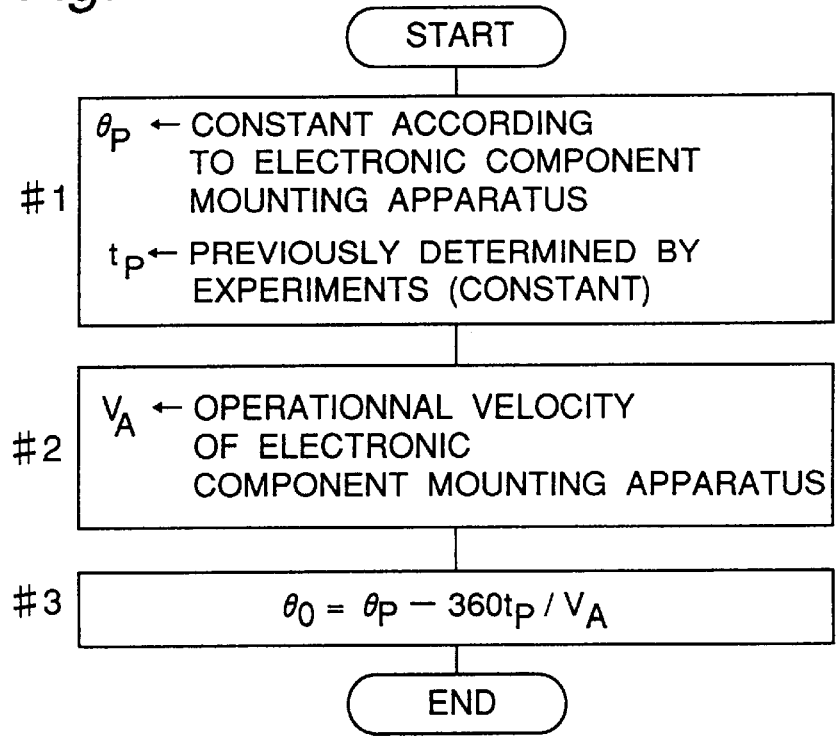
FIG. 7 is a flow chart showing the operation of the first embodiment of the present invention.

Referring to FIG. 6, the abscissa axis represents angular displacement of the input shaft 112, while the ordinate axes represent the air pressure of a suction nozzle and the height of the suction nozzle, respectively. Also, a curve x is the air pressure displacement curve, while a curve y is the nozzle height displacement curve, where the curve y has a certain pattern unique to each electronic component mounting apparatus. That is, when the operational velocity of the electronic component mounting apparatus becomes higher, T (sec) becomes shorter but the angular displacement 360 (deg) of the input shaft 112 remains unchanged. Thus, an angular displacement $\theta_L$ of the input shaft 112 formed when the nozzle has lowered until the nozzle height becomes zero, as well as an angular displacement $\theta_U$ of the input shaft 112 formed when the nozzle starts to rise, are both unchanged. The parameters as shown in FIGS. 6 and 7 as well as parameters to be used in the description have the following meanings:

[constant]: (when the characteristics of electronic components and the characteristics of the electronic component mounting apparatus are constant)
$P_S$: suction-enabling lower limit air pressure
$t_P$: time (sec) until the suction-enabling lower limit air pressure $P_S$ is reached
$\theta_P$: ideal suction timing rotational angle (deg) with the suction nozzle in the suction position

[variable]: (when the operational velocity of the electronic component mounting apparatus is varied)
$V_A$: operational velocity (sec/chip) of the electronic component mounting apparatus As shown above, with the electronic component and the electronic component mounting apparatus constant (predetermined), when the operational velocity of the electronic component mounting apparatus is varied, at step #1 of the flow chart of the first embodiment of the present invention as shown in FIG. 7, the suction-enabling lower limit air pressure $P_S$ is determined at a constant value by the combination of the electronic component to be mounted and the particular electronic component mounting apparatus, i.e., the particular suction nozzle. Therefore, the values of $P_S$ corresponding to various combinations of electronic component and suction nozzle are previously determined by experiments, so that they can be controlled by a table. Then, a search for the value corresponding to the combination of an electronic component to be mounted next and a set electronic component mounting apparatus is made from this table.

In FIG. 6, the ideal suction timing rotational angle $\theta_P$ (deg) is a timing rotational angle within a range of timing rotational angle $\theta_L$ to $\theta_U$, where the suction nozzle is properly positioned at the suction or release position. In other words $\theta_P$ is a timing rotational angle within a range over which the suction nozzle height shown by the height displacement curve y is zero, so that the ideal suction timing rotational angle can be defined by the following expression (1). Then, even if the operational velocity of the electronic component mounting apparatus has changed, the values of $\theta_L$ and $\theta_U$ will not change, and therefore are determined as values unique to the electronic component mounting apparatus.

$$\theta_L < \theta_P < \theta_U \quad (1)$$

Also, the time $t_P$ (sec) until the suction-enabling lower limit air pressure $P_S$ (sec) is reached is determined as a constant value depending on the combination of the electronic component to be mounted and the particular electronic component mounting apparatus to be used, i.e., the particular suction nozzle. Therefore, the values of $t_P$ corresponding to various combinations of electronic component and suction nozzle are previously determined as values unique to the electronic component mounting apparatus so that the values can be controlled by table. Then, a search for the value corresponding to the combination of an electronic component to be mounted next and a set electronic component mounting apparatus is made from this table.

At step #2 of FIG. 7, the operational velocity $V_A$ (sec/chip) of the electronic component mounting apparatus is set to a desired value given in a production schedule.

At step #3 of FIG. 7, the rotational angle $\theta_0$ of the operation timing of the suction/release drive unit 12a that switches over the mechanical valve 8a is calculated through the following steps.

First, a rotational angular velocity $\omega_A$ (deg/sec) of the input shaft 112 when the electronic component mounting apparatus operates at an operational velocity $V_A$ (sec/chip) is calculated by the expression (4):

$$\omega_A = 360/V_A (\text{deg/sec}) \quad (4)$$

Then, the time lag $t_P$ (sec) elapsing from when the mechanical valve 8a is switched over to when the suction-enabling lower limit air pressure $P_S$ is reached is converted into a rotational angle difference $\Delta\theta$ (deg) by the expression (5):

$$\Delta\theta = \omega_A \times t_P = 360 t_P/V_A (\text{deg}) \quad (5)$$

Finally, an operational timing rotational angle $\theta_0$ for the suction/release drive unit 12a of the mechanical valve 8a is calculated by the expression (6):

$$\theta_0 = \theta_P - \Delta\theta = \theta_P - 360 t_P/V_A (\text{deg}) \quad (6)$$

Using the resulting $\theta_0$, the suction/release drive unit 12a of the mechanical valves 8 is operated by a control unit 200. Then, as shown in FIG. 6, the air pressure of the suction nozzle 5a reaches the suction-enabling lower limit air pressure $P_S$ while the angular displacement of the input shaft 112 falls upon an ideal suction timing rotational angle $\theta_P$. Thus, stable sucking operation can be implemented.

Further, also for the mounting process, the case is similar only with the gradient of the air-pressure displacement curve x inverted, so that the operational timing rotational angles $\theta_0$ of the suction/release drive units 12b, 12c of the mechanical valves 8 can be calculated. Thus, when the suction/release drive units 12b, 12c of the mechanical valves 8 are operated by the control unit 200, then stable mounting operation and releasing operation can be implemented.

A second embodiment of the electronic component mounting apparatus, to which the electronic component mounting method of an embodiment of the present invention is applied, relates to the way of calculating the switching timing for the mechanical valve corresponding to the characteristics of electronic components to be mounted, such as their weight and shape. This will be explained below with reference to FIGS. 1, 6, and 8. It is noted that its aspects common to the first embodiment are omitted in the description.

Figure 8:
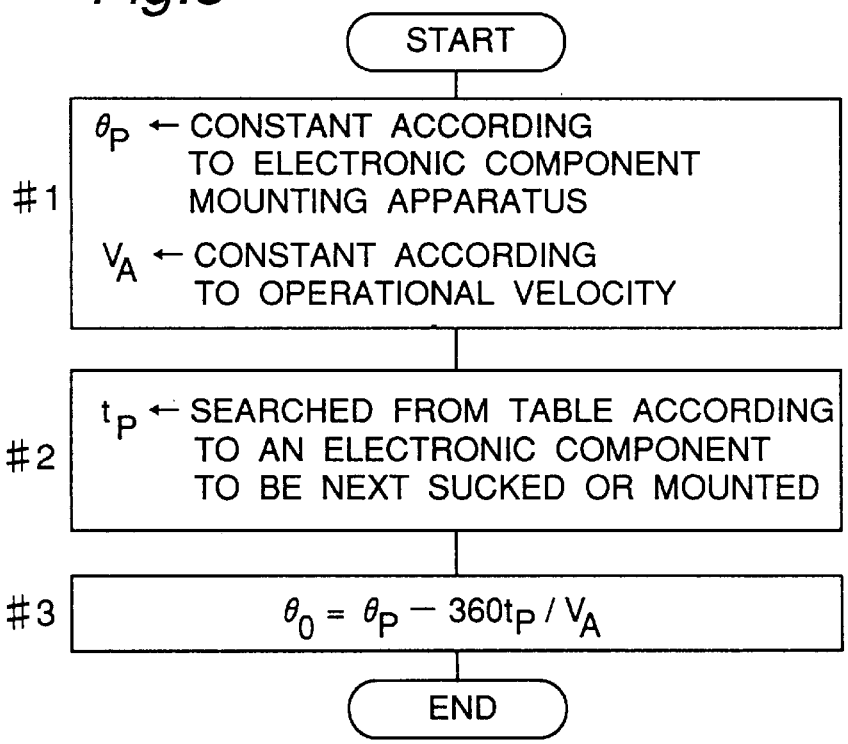
FIG. 8 is a flow chart showing the operation of the second embodiment of the present invention.

The parameters as shown in FIGS. 6 and 8 as well as parameters to be used in the description have the following meanings.

[constant]: (when the operational velocity of the electronic component mounting apparatus and the characteristics of the electronic component mounting apparatus are constant (predetermined))

$\theta_P$: ideal suction timing rotational angle (deg) with the suction nozzle in the suction position $V_A$: operational velocity of the electronic component mounting apparatus (sec/chip)

[variable]: (when various types of electronic components are used)

$P_S$: suction-enabling lower limit air pressure $t_P$: time (sec) until the suction-enabling lower limit air pressure $P_S$ is reached As shown above, with the electronic component mounting apparatus and the electronic component mounting apparatus constant (predetermined), various types of electronic components may be used. In this case, at step #1 of the flow chart of the second embodiment of the present invention as shown in FIG. 8, the ideal suction timing rotational angle $\theta_P$ (deg) at which the suction nozzle is positioned in the suction position is determined in the same way as in the first embodiment.

The operational velocity $V_A$ (sec/chip) of the electronic component mounting apparatus is set to a desired value given in a production schedule.

At step #2 of FIG. 8, a search for the suction-enable lower limit air pressure $P_S$ is made with respect to the combination of an electronic component to be mounted next and a set suction nozzle in the same way as in the first embodiment.

Then, the time $t_P$ (sec) until the suction-enabling lower limit air pressure $P_S$ is reached is processed for table creation in the same way as in the first embodiment. From this table, a $t_P$ corresponding to the combination of an electronic component to be mounted next and a set electronic component mounting apparatus is searched for. FIGS. 26 and 27 show examples of the tables showing the relationship between the time $t_P$ (sec) and the suction-enable lower limit air pressure $P_S$ depending on the nozzles and the weights of the components to be mounted. For example, from the table of FIG. 26, when the nozzle A is used and the weight of the component is 11g, it can be easily found that the suction-enabling lower limit air pressure $P_S$ is 150 mmHg and the time $t_P$ is 16 sec.

At step #3 of FIG. 8, an operational timing rotational angle $\theta_0$ for the suction/release drive unit 12a of the mechanical valve 8a is calculated by the expression (6):

$$\theta_0 = \theta_P - \Delta\theta = \theta_P - 360 t_P/V_A (\text{deg}) \quad (6)$$

Using the resulting $\theta_0$, the suction/release drive unit 12a of the mechanical valve 8 is operated by the control unit 200. Then, as shown in FIG. 6, the air pressure of the suction nozzle 5a reaches the suction-enabling lower limit air pressure $P_S$ while the angular displacement of the input shaft 112 falls upon the ideal suction timing rotational angle $\theta_P$. Thus, stable sucking operation can be implemented.

Further, also for the mounting process, the case is similar only with the gradient of the air-pressure displacement curve x inverted, so that the operational timing rotational angles $\theta_0$ of the suction/release drive units 12b, 12c of the mechanical valves 8 can be calculated. Thus, when the suction/release drive units 12b, 12c of the mechanical valves 8 are operated by the control unit 200, then stable mounting operation and releasing operation can be implemented.

Figure 9:
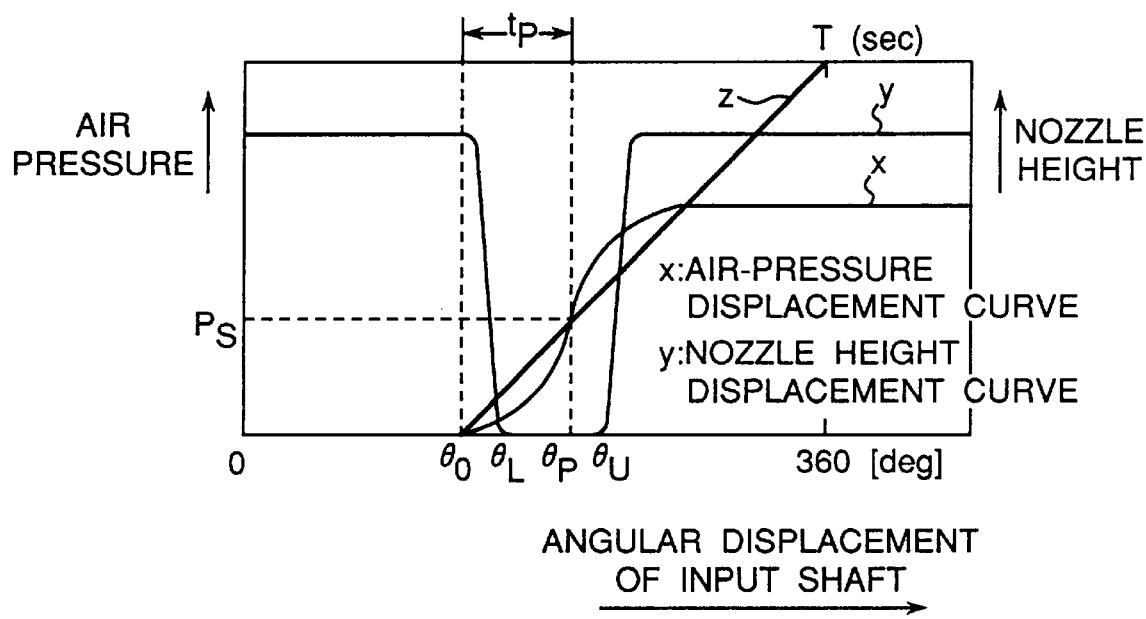
FIG. 9 is a chart showing the way of determining optimum suction and release timing in the third, fifth, seventh embodiments of the present invention.

A third embodiment of the electronic component mounting apparatus, to which the electronic component mounting method of an embodiment of the present invention is applied, relates to the way of calculating the switching timing for the mechanical valve corresponding to the characteristics of electronic components to be mounted, such as their weight and shape, as in the second embodiment. In the second embodiment, the table of time $t_P$ (sec) until the suction-enable lower limit air pressure $P_S$ is reached is previously produced through experiments with respect to the combinations of various types of electronic components and various types of electronic component mounting apparatus, and a time $t_P$ matching the conditions is searched for from the table. However, in this third embodiment, as shown in FIG. 9, the air-pressure displacement curve x is linearly approximated by a straight line z (gradient $C = P_S/t_P$), whereby the expression (6) is transformed into an expression (7). The third embodiment is described below with reference to FIGS. 1, 9, and 10, where its aspects common to the first or second embodiment are omitted in description.

$$\theta_0 = \theta_P - \Delta\theta = \theta_P - 360 P_S/CV_A (\text{deg}) \quad (7)$$

Figure 10:
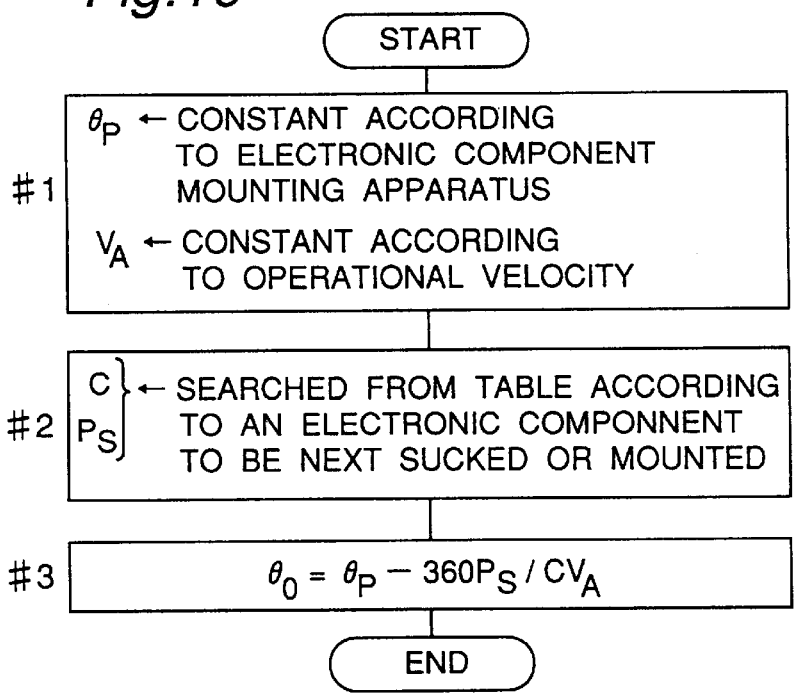
FIG. 10 is a flow chart showing the operation of the third embodiment of the present invention.

The contents of the above can be expressed as in the flow chart of FIG. 10.

At step #1 of FIG. 10, the ideal suction timing rotational angle $\theta_P$ (deg) at which the suction nozzle is in the suction position is determined in the same way as in the second embodiment.

The operational velocity $V_A$ (sec/chip) of the electronic component mounting apparatus is set to a desired value given in a production schedule.

At step #2 of FIG. 10, air-pressure displacement curves x are previously determined through experiments from various combinations of electronic components and electronic component mounting apparatus with respect to the relevant electronic component mounting apparatus, and these air-pressure displacement curves x are linearly approximated. Therefore, a table of gradient $C=P_S/t_P$ for the combinations of various types of electronic components and various types of electronic component mounting apparatus is prepared beforehand. Then, a C corresponding to the combination of an electronic component to be next mounted and a set electronic component mounting apparatus is searched for from the table. FIGS. 28 and 29 show examples of the tables showing the relationship between the suction-enabling lower limit air pressure $P_S$ and the gradient C depending on the nozzles and the weights of the components to be mounted. For example, from the table of FIG. 28, when the nozzle A is used and the weight of the component is 11g, it can be easily found that the suction-enabling lower limit air pressure $P_S$ is 150 mmHg and the gradient C is 9.43.

The suction-enabling lower limit air pressure $P_S$ is determined in the same way as in the second embodiment.

At step #3 of FIG. 10, an operational timing rotational angle $\theta_0$ for the suction/release drive unit 12a of the mechanical valve 8a is calculated by the expression (7):

$$\theta_0=\theta_P-\Delta\theta=\theta_P-360P_S/CV_A(\deg) \tag{7}$$

Using the resulting $\theta_0$, the suction/release drive unit 12a of the mechanical valve 8 is operated by the control unit 200. Then, as shown in FIG. 9, the air pressure of the suction nozzle 5a reaches the suction-enabling lower limit air pressure $P_S$ while the angular displacement of the input shaft 112 falls upon the ideal suction timing rotational angle $\theta_P$. Thus, stable sucking operation can be implemented.

Further, also for the mounting process, the case is similar only with the gradient of the air-pressure displacement curve x inverted, so that the operational timing rotational angles $\theta_0$ of the suction/release drive units 12b, 12c of the mechanical valves 8 can be calculated. Thus, when the suction/release drive units 12b, 12c of the mechanical valves 8 are operated by the control unit 200, then stable mounting operation and releasing operation can be implemented.

A fourth embodiment of the electronic component mounting apparatus, to which the electronic component mounting method of an embodiment of the present invention is applied, relates to the way of calculating the switching timing for the mechanical valve corresponding to the characteristic changes of the electronic component mounting apparatus. This embodiment is described below with reference to FIGS. 1, 11, and 12, where its aspects common to the first embodiment are omitted in description.

Figure 11:
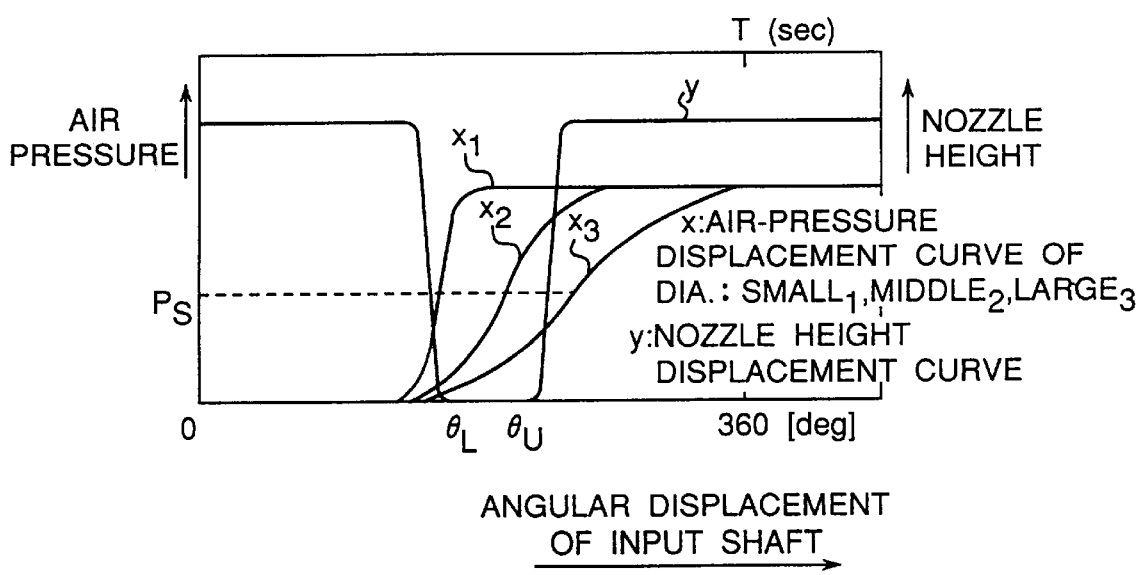
FIG. 11 is a chart showing the way of determining optimum suction and release timing in the fourth embodiment of the present invention.

Referring to FIG. 11, the abscissa axis represents angular displacement of the input shaft 112, while the ordinate axes represent the air pressure of suction nozzles and the height of the suction nozzles, respectively. Also, curves $x_1$, $x_2$, and $X_3$ are air pressure displacement curves showing the suction nozzles 5 having small, middle, and large diameters of nozzle holes, respectively, while a curve y is the nozzle height displacement curve.

Figure 12:
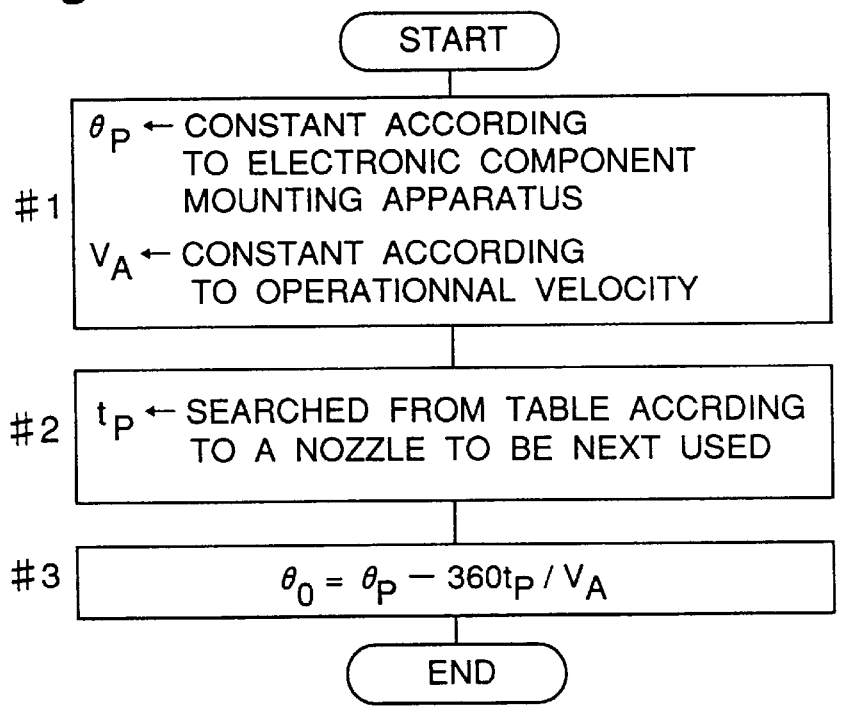
FIG. 12 is a flow chart showing the operation of the fourth embodiment of the present invention.

The parameters as shown in FIGS. 11 and 12 as well as parameters to be used in the description have the following meanings:

[constant]: (when the operational velocity of the electronic component mounting apparatus and the characteristics of electronic components are constant)

$P_S$: suction-enabling lower limit air pressure $\theta_P$: ideal suction timing rotational angle (deg) with the suction nozzle in the suction position $V_A$: operational velocity of the electronic component mounting apparatus (sec/chip)

[variable]: (when the electronic component mounting apparatus is varied/changed)

$t_P$: time (sec) until the suction-enabling lower limit air pressure $P_S$ is reached As shown above, with the operational velocity of the electronic component mounting apparatus and the electronic components predetermined, the electronic component mounting apparatus can be varied/changed, In this case, at step #1 of the flow chart of the present embodiment as shown in FIG. 12, the suction-enabling lower limit air pressure $P_S$ is determined in the same way as in the first embodiment.

The ideal suction timing rotational angle $\theta_P$ (deg) at which the suction nozzle is in the suction position is determined in the same way as in the first embodiment.

The operational velocity $V_A$ (sec/chip) of the electronic component mounting apparatus is set to a desired value given in a production schedule.

At step #2 of FIG. 12, the time $t_P$ elapsing from when the mechanical valve 8 is opened to when the air pressure of the suction nozzle reaches the suction-enabling lower limit air pressure $P_S$ is processed for table creation in the same way as in the first embodiment. From this table, a $t_P$ corresponding to the combination of an electronic component to be next mounted and a suction nozzle specified by a production schedule is searched for. As examples of the table, the tables shown in FIGS. 26 and 27 can be used.

At step #3 of FIG. 12, upon determination of the tp corresponding to the aforementioned specified suction nozzle, an ideal switching timing rotational angle $\theta_0$ of the mechanical valve 8 is calculated in the same way as in the first embodiment by the expression (6):

$$\theta_0=\theta_P-\Delta\theta=\theta_P-360t_P/V_A(\deg) \tag{6}$$

Using the resulting $\theta_0$, the suction/release drive unit 12a of the mechanical valve 8 is operated by the control unit 200. Then, as shown in FIG. 6, the air pressure of the suction nozzle 5a reaches the suctionenable lower limit air pressure $P_S$ while the angular displacement of the input shaft 112 falls upon the ideal suction timing rotational angle $\theta_P$. Thus, stable sucking operation can be implemented.

Further, also for the mounting process, the case is similar only with the gradient of the air-pressure displacement curve x inverted, so that the operational timing rotational angles $\theta_0$ of the suction/release drive units 12b, 12c of the mechanical valves 8 can be calculated. Thus, when the suction/release drive units 12b, 12c of the mechanical valves 8 are operated by the control unit 200, then stable mounting operation and releasing operation can be implemented.

A fifth embodiment of the electronic component mounting apparatus, to which the electronic component mounting method of an embodiment of the present invention is applied, relates to the way of calculating the switching timing for the mechanical valve. The switching timing is calculated corresponding valve corresponding to the characteristics of the electronic component mounting apparatus under the condition that the operational velocity of the electronic component mounting apparatus and the electronic components are predetermined as in the fourth embodiment. In the fourth embodiment, it has been arranged that the values of $t_P$ before the suction-enabling lower limit air pressure $P_S$ is reached are previously determined through experiments to produce a table with respect to the individual suction nozzles. From the resulting table, the $t_P$ of a suction nozzle specified in a production schedule is searched for. As examples of the table, the tables shown in FIGS. 28 and 29 can be used. In the fifth embodiment, on the other hand, the air-pressure displacement curve x is linearly approximated by a straight line z (gradient $C=P_S/t_P$) as shown in FIG. 9, as it is in the third embodiment, and the ideal switching timing rotational angle $\theta_0$ for the mechanical valve 8 is calculated by the expression (7):

$$\theta_0=\theta_P-\Delta\theta=\theta_P-360P_S/CV_A(\text{deg}) \tag{7}$$

The present embodiment is described below, where its aspects common to the first, third, and fourth embodiments are omitted in description.

Figure 13:
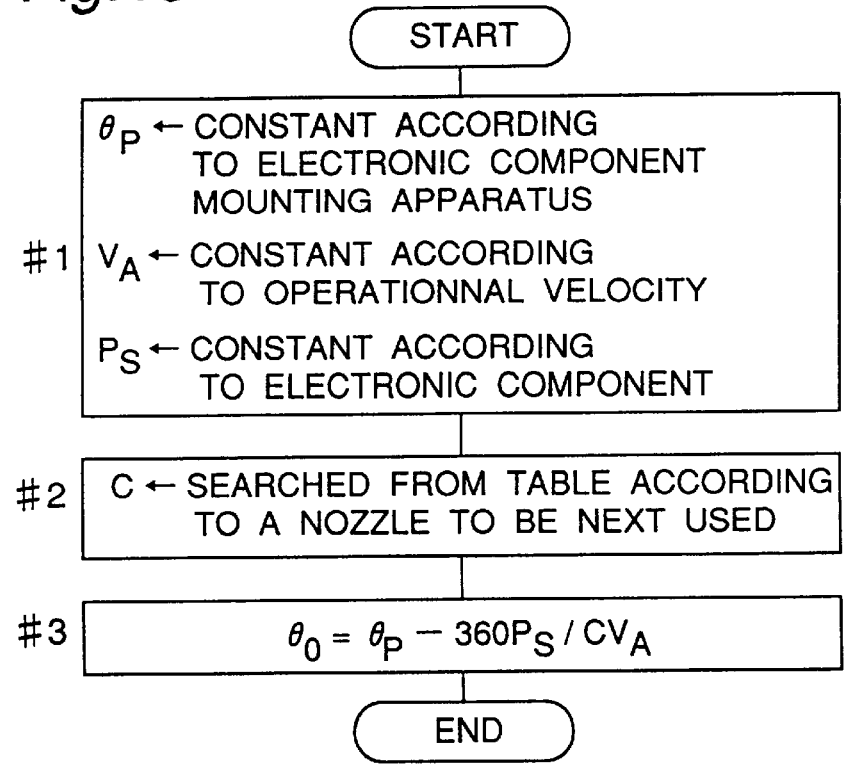
FIG. 13 is a flow chart showing the operation of the fifth embodiment of the present invention.

At step #1 of the flow chart of the present embodiment as shown in FIG. 13, the ideal suction timing rotational angle $\theta_P$ (deg) at which the suction nozzle is in the suction position is determined in the same way as in the first embodiment.

The operational velocity $V_A$ (sec/chip) of the electronic component mounting apparatus is set to a desired value given in a production schedule.

The suction-enabling lower limit air pressure $P_S$ is determined in the same way as in the fourth embodiment.

At step #2 of FIG. 13, a table with respect to the gradient C of the approximated straight line is produced as in the third embodiment. Then, from the table, a C corresponding to the combination of an electronic component to be used next and a suction nozzle specified in the production schedule is searched for.

At step #3 of FIG. 13, upon the determination of C, an ideal switching timing rotational angle $\theta_0$ of the mechanical valve 8 is calculated in the same way as in the third embodiment by the expression (7):

$$\theta_0=\theta_P-\Delta\theta=\theta_P-360P_S/CV_A(\text{deg}) \tag{7}$$

Using the resulting $\theta_0$, the suction/release drive unit 12a of the mechanical valve 8 is operated by the control unit 200. Then, as shown in FIG. 9, the air pressure of the suction nozzle 5a reaches the suction-enabling lower limit air pressure $P_S$ while the angular displacement of the input shaft 112 falls upon the ideal suction timing rotational angle $\theta_P$. Thus, stable sucking operation can be implemented.

Further, also for the mounting process, the case is similar only with the gradient of the air-pressure displacement curve x inverted, so that the operational timing rotational angles $\theta_0$ of the suction/release drive units 12b, 12c of the mechanical valves 8 can be calculated. Thus, when the suction/release drive units 12b, 12c of the mechanical valves 8 are operated by the control unit 200, then stable mounting operation and releasing operation can be implemented.

A sixth embodiment of the electronic component mounting apparatus, to which the electronic component mounting method of an embodiment of the present invention is applied, relates to the way of calculating the switching timing for the mechanical valve. The switching timing is calculated corresponding to the operational velocity of the electronic component mounting apparatus, the characteristics (weight, shape, etc.) of electronic components to be mounted, and variations in the characteristics (diameter of the nozzle hole, etc.) of the electronic component mounting apparatus. The sixth embodiment is described below by referring to the foregoing first to fifth embodiments.

Parameters to be used in the description have the following meanings, where the ideal switching timing rotational angle $\theta_0$ for the mechanical valve 8 is calculated from these parameters:

[constant]:
$\theta_P$: ideal suction timing rotational angle (deg) with the suction nozzle in the suction position

[variable]: (when the operational velocity of the electronic component mounting apparatus, the electronic component to be mounted, and the electronic component mounting apparatus are varied/changed)

$P_S$: suction-enabling lower limit air pressure $t_P$: time (sec) until the suction-enabling lower limit air pressure is reached $V_A$: operational velocity (sec/chip) of the electronic component mounting apparatus As shown above, when the operational velocity of the electronic component mounting apparatus, the electronic component to be mounted, and the electronic component mounting apparatus can be varied/changed, In this case, at step #1 of the flow chart of the present embodiment as shown in FIG. 14, the ideal suction timing rotational angle $\theta_0$ (deg) at which the suction nozzle is in the suction position is set in the same way as in the first embodiment.

At step #2 of FIG. 14, the operational velocity $V_A$ (sec/chip) of the electronic component mounting apparatus is set to a desired value given in a production schedule.

The time $t_P$ elapsing from when the mechanical valve 8 is opened to when the air pressure of the suction nozzle reaches the suction-enabling lower limit air pressure $P_S$ is experimentally determined for table creation with respect to the combinations of various electronic components and various suction nozzles. Then, from the table, a $t_P$ corresponding to the combination of an electronic component to be mounted next and a suction nozzle to be used next, which are specified in the production schedule, is searched for. As examples of the table, the tables shown in FIGS. 26 and 27 can be used.

At step #3 of FIG. 14, from the $\theta_P$ set at step #1 and the $V_A$ and $t_P$ set at step #2, the ideal switching timing rotational angle $\theta_0$ of the mechanical valve 8 is calculated in the same way as in the first embodiment by the expression (6):

$$\theta_0=\theta_P-\Delta\theta=\theta_P-360t_P/V_A(\text{deg}) \tag{6}$$

Using the resulting $\theta_0$, the suction/release drive unit 12a of the mechanical valve 8 is operated by the control unit 200. Then, as shown in FIG. 6, the air pressure of the suction nozzle 5a reaches the suction-enabling lower limit air pressure $P_S$ while the angular displacement of the input shaft 112 falls upon the ideal suction timing rotational angle $\theta_0$. Thus, stable sucking operation can be implemented.

Further, also for the mounting process, the case is similar only with the gradient of the air-pressure displacement curve x inverted, so that the operational timing rotational angles $\theta_0$ of the suction/release drive units 12b, 12c of the mechanical valves 8 can be calculated. Thus, when the suction/release drive units 12b, 12c of the mechanical valves 8 are operated by the control unit 200, then stable mounting operation and releasing operation can be implemented.

A seventh embodiment of the electronic component mounting apparatus, to which the electronic component mounting method of an embodiment of the present invention is applied, relates to the way of calculating the switching timing for the mechanical valve corresponding to the operational velocity of the electronic component mounting apparatus, the characteristics (weight, shape, etc.) of electronic components to be mounted, and variations in the characteristics (diameter of the nozzle hole, etc.) of the electronic component mounting apparatus, as in the sixth embodiment. In the sixth embodiment, it has been arranged that the time $t_P$ until the suction-enabling lower limit air pressure $P_S$ is reached is experimentally determined for table creation with respect to various electronic components and various suction nozzles. From the table, a $t_P$ corresponding to the combination of an electronic component to be mounted next and a suction nozzle to be used next, which are specified by a production schedule, is searched for. In the seventh embodiment, on the other hand, in the same way as in the third embodiment, as shown in FIG. 9, the air-pressure displacement curve x is linearly approximated by a straight line z (gradient C=$P_S/t_P$) and the ideal switching timing rotational angle $\theta_0$ for the mechanical valve 8 is calculated by the expression (7):

$$\theta_0=\theta_P-\Delta\theta=\theta_P-360P_S/CV_A(\text{deg}) \qquad (7)$$

At step #1 of the flow chart of FIG. 15, which shows the operation of the present embodiment, the ideal suction timing rotational angle $\theta_P$ (deg) at which the suction nozzle is in the suction position is determined in the same way as in the sixth embodiment.

Figure 31:
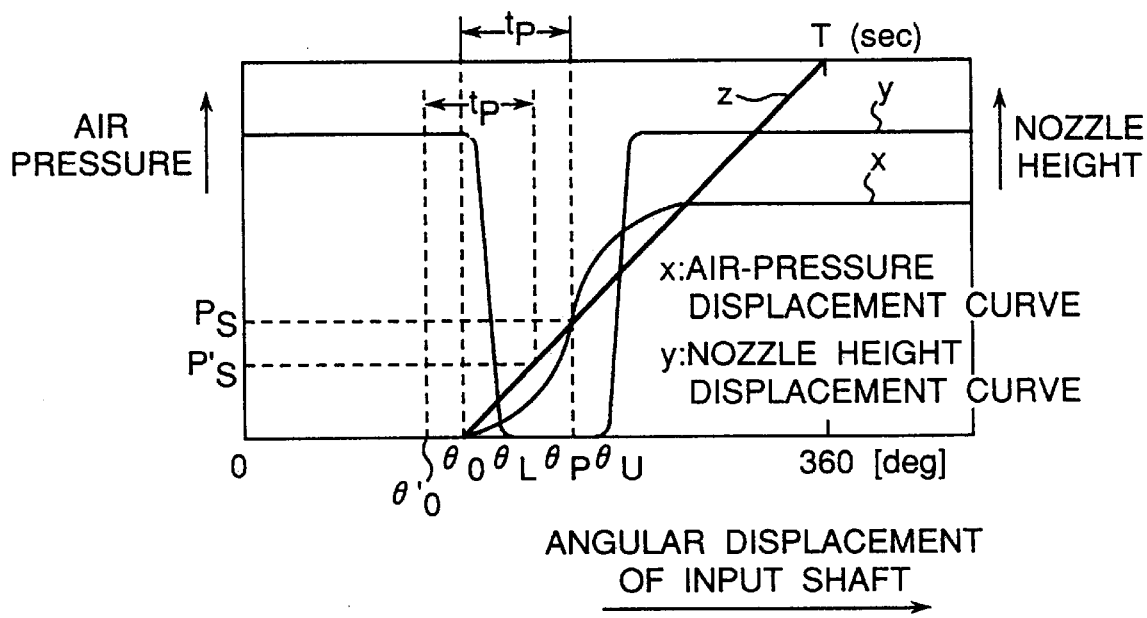
FIG. 31 is a chart showing the way of determining optimum suction and release timing in the third, fifth, seventh embodiments of the present invention when the components are different from those in FIG. 9.

FIG. 31 is a chart showing the way of determining optimum suction and release timing in the third, fifth, and seventh embodiments of the present invention when the components are different from those in FIG. 9. That is, from this example, it is found that when the components are different from those of FIG. 9, the suction-enabling lower limit air pressure is changed from $P_S$ to $P'_S$, and then the operational timing rotational angle is also changed from $\theta_0$ to $\theta'_0$ based on the approximation straight line T.

At step #2 of FIG. 15, the operational velocity $V_A$ (sec/chip) of the electronic component mounting apparatus is set as one of the set conditions.

The air-pressure displacement curve x is linearly approximated with respect to the gradient C=$P_S/t_P$ of the approximated straight line, while $t_P$ is experimentally determined for various types of combinations of electronic components and electronic component mounting apparatus with respect to the gradient C=$P_S/t_P$ of the approximated straight line. Then, those air-pressure displacement curves x are linearly approximated so that a table of gradient C=$P_S/t_P$ relative to the combinations of the various electronic components and the various suction nozzles is produced beforehand. From this table, a C corresponding to the combination of an electronic component to be mounted next and a suction nozzle to be used next, which are specified by the production schedule, is searched for. As examples of the table, the tables shown in FIGS. 28 and 29 can be used.

The suction-enabling lower limit air pressure $P_S$ is determined, as in the sixth embodiment, by searching for a $P_S$ corresponding to the combination of an electronic component to be mounted next and a suction nozzle to be used next, which are specified by the production schedule.

At step #3 of FIG. 15, upon the determination of the operational velocity $V_A$ of the electronic component mounting apparatus, the gradient C of the approximated straight line, and the suction-enabling lower limit air pressure $P_S$ in the step #2, the ideal switching timing rotational angle $\theta_0$ of the mechanical valve 8 is calculated in the same way as in the third embodiment by the expression (7)

$$\theta_0=\theta_P-\Delta\theta=\theta_P-360P_S/CV_A(\text{deg}) \qquad (7)$$

Using the resulting $\theta_0$, the suction/release drive unit 12a of the mechanical valve 8 is operated by the control unit 200. Then, as shown in FIG. 9, the air pressure of the suction nozzle 5a reaches the suction-enabling lower limit air pressure $P_S$, while the angular displacement of the input shaft 112 falls upon the ideal suction timing rotational angle $\theta_P$. Thus, stable sucking operation can be implemented.

Further, also for the mounting process, the case is similar only with the gradient of the air-pressure displacement curve x inverted, so that the operational timing rotational angles $\theta_0$ of the suction/release drive units 12b, 12c of the mechanical valves 8 can be calculated. Thus, when the suction/release drive units 12b, 12c of the mechanical valves 8 are operated by the control unit 200, then stable mounting operation and releasing operation can be implemented.

As shown above, when triggers are applied for the switching of a suction switch or a release switch with the ideal switching timing rotational angle $\theta_0$ obtained in the first to seventh embodiments, then the electronic components can be sucked and mounted at ideal timings.

Figure 16:
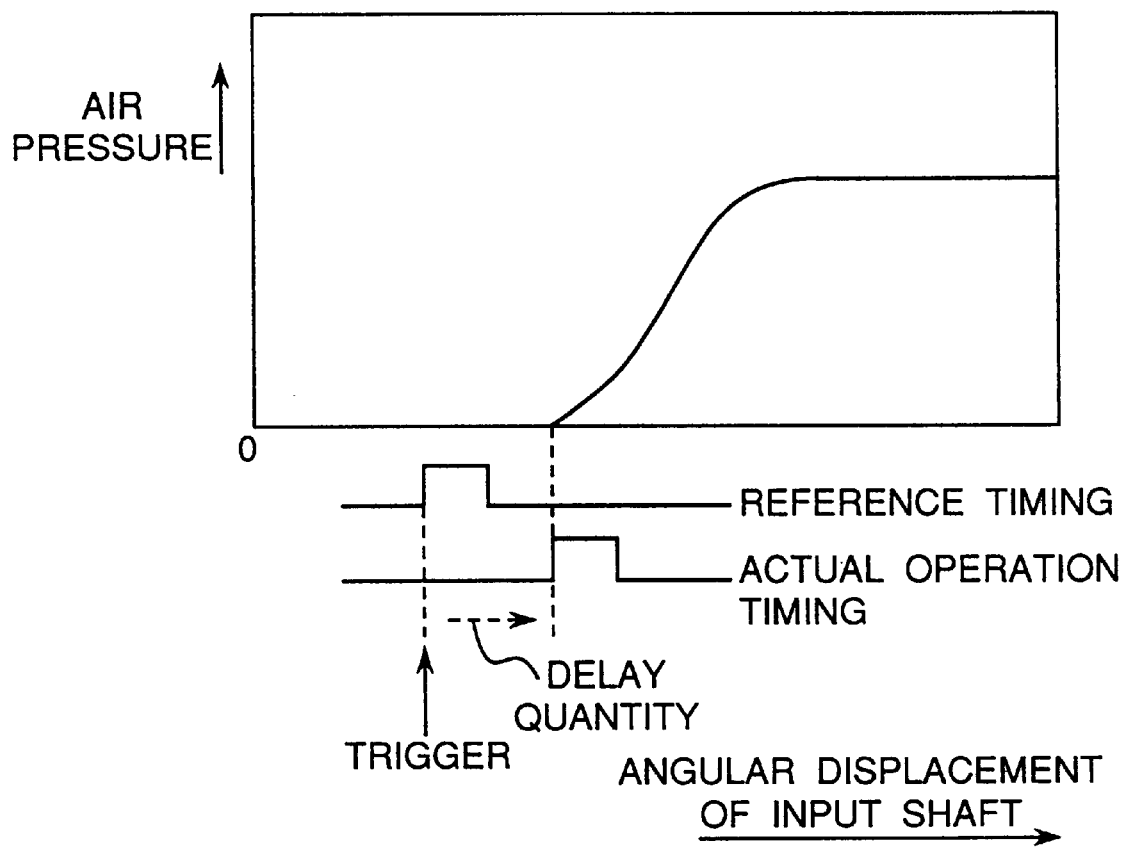
FIG. 16 is a chart showing the way of controlling the suction and release timing in an embodiment of the present invention.

Other than the aforementioned triggers, timers are also available. This is a method that, for the calculated ideal switching timing rotational angle $\theta_0$, a delay quantity is added to one reference timing, as shown in FIG. 16. In this case, one trigger for reference timing will do. The operation in this case is shown in the flow chart of FIG. 17.

Figure 17:
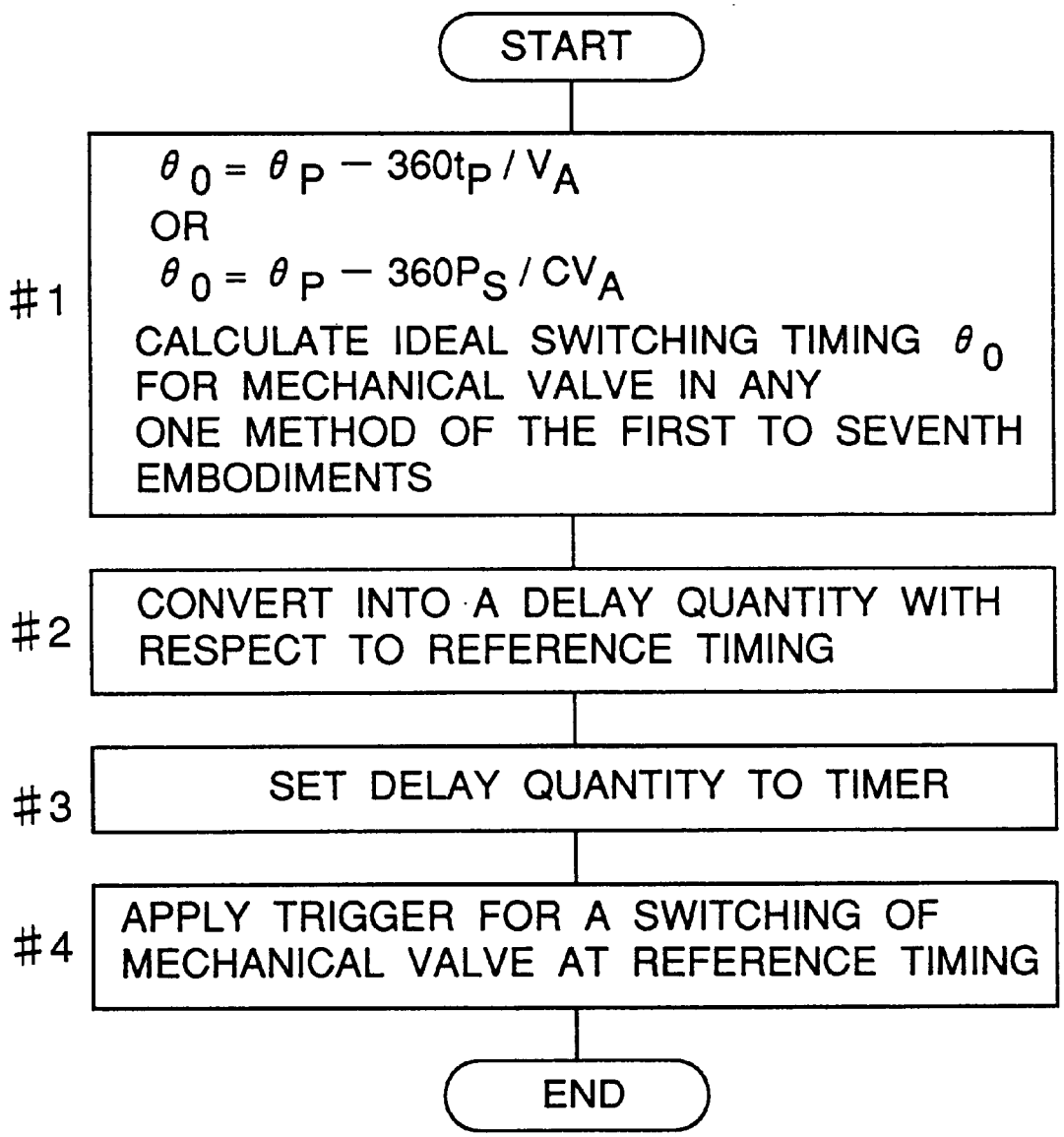
FIG. 17 is a flow chart showing the operation of controlling the suction and release timing in the embodiment of the present invention.

At step #1 of FIG. 17, the ideal switching timing rotational angle $\theta_0$ is determined in the same way as any one of the first to seventh embodiments.

At step #2 of FIG. 17, the ideal switching timing rotational angle $\theta_0$ is converted into a delay quantity for the reference timing.

At step #3 of FIG. 17, the delay quantity is set to a timer. This timer is provided within the control unit 200 by software.

At step #4 of FIG. 17, a trigger for switching over the mechanical valve is applied at the reference timing.

In the electronic component mounting method of the above embodiment of the present invention and the electronic component mounting apparatus of the above embodiment of the present invention, by determining a time lag. This time lag is from when a suction/release switching of the valve is performed, by which the suction nozzle is switched over when the component is sucked with the suction nozzle and when the sucked component is released therefrom, until when the suction nozzle actually sucks up or releases off the electronic component. The switching in the suction and release of the valve is performed at a timing earlier by an extent of the time lag than the timing at which the suction nozzle is properly positioned at the suction or release position. Thus, the present method and apparatus have an advantage that the electronic components can be sucked and released at an optimum timing at all times and without trial and error.

Also, in the electronic component mounting method of the above embodiment, when the time lag is set in correspondence to the operational velocity of the electronic component mounting apparatus, then the electronic components can be sucked and released at optimum timing at all times with various operational velocities.

Further, in the electronic component mounting method of the above embodiment, when the time lag is set in correspondence to the characteristics of the electronic components to be mounted, such as their weight and shape, which affect the suction-enabling lower limit air pressure, then all the electronic components to be mounted can be sucked and released at optimum timing at all times.

Further, in the electronic component mounting method of the above embodiment, when the time lag is set in correspondence to the characteristics of the suction nozzles, such as the sizes of their nozzle holes (which affect the increasing or decreasing speed of air pressure of the suction nozzles)

then the electronic components can be sucked and released at optimum timing at all times with various types of suction nozzles.

Further, in the electronic component mounting method of the above embodiment, when the time lag is set in correspondence to two or more combinational conditions (from among the operational velocity of the electronic component mounting apparatus, the characteristics of electronic components to be mounted, such as their weight and shape, which affect the suction-enabling lower limit air pressure, and the characteristics of the suction nozzles, such as the size of their nozzle holes, which affect the increasing or decreasing speed of air pressure of the suction nozzles) then the electronic components can be sucked and released at optimum timing at all times under various types of operational conditions of the electronic component mounting apparatus.

Consequently, the electronic components can be reduced in the possibilities of mis-suction and mounting-position shifts, so that the product quality can be improved. Also, even if the working conditions for the electronic component mounting process are varied over a wide range, the optimum suction/release timing can be realized at all times. Thus, there can be provided an advantage that the electronic component mounting work can more easily be attained faster.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting apparatus comprising:
   a suction nozzle for sucking an electronic component and mounting the electronic component on a mounting board;
   a moving device for moving said nozzle in an upward direction and a downward direction;
   an air pressure switching unit for switching levels of air pressure to said nozzle when said nozzle is at an electronic component suction position and when said nozzle is at an electronic component mounting position; and
   a switching drive unit for operating said air pressure switching unit so as to independently control a timing point for a switch of air pressure levels to said nozzle when said nozzle is sucking the electronic component, and so as to independently control a timing point for a switch of air pressure levels to said nozzle when said nozzle is mounting the electronic component on the board, wherein a cycle rate of said nozzle is defined as a rate of travel of said nozzle from a first upper position through a lower position to a second upper position, said switching drive unit operating said air pressure switching unit based on said cycle rate of said nozzle.

2. The apparatus of claim 1, further comprising:
   a detection device for detecting a position of said nozzle as said nozzle is moved by said moving device, and for generating a signal based on the detected position of said nozzle; and
   a control unit for receiving the signal from said detection device, and for controlling said switching drive unit and said air pressure switching unit based on the signal.

3. The apparatus of claim 1, wherein said air pressure switching unit comprises a valve having a suction switch and a release switch.

4. The apparatus of claim 3, wherein said switching drive unit comprises a rocking lever, a motor for moving said rocking lever in a reciprocating manner, and an acting piece at an end of said rocking lever, said switching drive unit being arranged such that said acting piece is capable of contacting said suction switch of said air pressure switching unit and said release switch of said air pressure switching unit.

5. The apparatus of claim 1, wherein said switching drive unit comprises a rocking lever, a motor for moving said rocking lever in a reciprocating manner, and an acting piece at an end of said rocking lever, said switching drive unit being arranged such that said acting piece is capable of contacting said air pressure switching unit.

6. The apparatus of claim 1, wherein said suction nozzle comprises a first suction nozzle, further comprising a second suction nozzle and a rotating member, said first suction member and second suction member being arranged at equal intervals at an end of said rotating member.

7. The apparatus of claim 1, wherein a height of the first upper position equals a height of the second upper position.

8. The apparatus of claim 1, wherein said cycle rate is based on a vertical velocity of said nozzle.

9. An electronic component mounting apparatus comprising:
   a suction nozzle for sucking an electronic component and mounting the electronic component on a mounting board;
   a moving device for moving said nozzle in an upward direction and a downward direction;
   an air pressure switching unit for switching levels of air pressure to said nozzle;
   a switching drive unit for operating said air pressure switching unit so as to independently control a timing point for a switch of air pressure levels to said nozzle when said nozzle is sucking the electronic component, and so as to independently control a timing point for a switch of air pressure levels to said nozzle when said nozzle is mounting the electronic component on the board, wherein a cycle rate of said nozzle is defined as a rate of travel of said nozzle from a first upper position through a lower position to a second upper position, said switching drive unit opening said air pressure switching unit based on said cycle rate of said nozzle;
   an air suction mechanism;
   a suction air passage connecting said air suction mechanism and said suction nozzle, said air pressure switching unit being provided in said suction air passage; and
   a control unit for controlling said switching drive unit such that said air pressure switching unit effects a switching of levels of air pressure to said nozzle before said nozzle arrives at an electronic component suction position and before said nozzle arrives at an electronic component mounting position, wherein a time period between the switching of levels of air pressure to said nozzle and the arrival of said nozzle at one of the electronic component suction position and the electronic component mounting position equals a time period between the switching of levels of air pressure to said nozzle and one of a release of the electronic component at an electronic component mounting position or a suction of the electronic component at an electronic component suction position.

10. The apparatus of claim 9, further comprising:

a detection device for detecting a position of said nozzle as said nozzle is moved by said moving device, and for generating a signal based on the detected position of said nozzle, wherein said control unit receives the signal from said detection device and controls said switching drive unit and said air pressure switching unit based on the signal.

11. The apparatus of claim 9, wherein said air pressure switching unit comprises a valve having a suction switch and a release switch.

12. The apparatus of claim 11, wherein said switching drive unit comprises a rocking lever, a motor for moving said rocking lever in a reciprocating manner, and an acting piece at an end of said rocking lever, said switching drive unit being arranged such that said acting piece is capable of contacting said suction switch of said air pressure switching unit and said release switch of said air pressure switching unit.

13. The apparatus of claim 9, wherein said switching drive unit comprises a rocking lever, a motor for moving said rocking lever in a reciprocating manner, and an acting piece at an end of said rocking lever, said switching drive unit being arranged such that said acting piece is capable of contacting said air pressure switching unit.

14. The apparatus of claim 9, wherein said suction nozzle comprises a first suction nozzle, further comprising a second suction nozzle and a rotating member, said first suction member and second suction member being arranged at equal intervals at an end of said rotating member.

15. The apparatus of claim 9, wherein a height of the first upper position equals a height of the second upper position.

16. The apparatus of claim 9, wherein said cycle rate is based on a vertical velocity of said nozzle.

* * * * *